United States Patent
Lee et al.

(10) Patent No.: US 11,411,180 B2
(45) Date of Patent: Aug. 9, 2022

(54) PHASE-CHANGE MEMORY DEVICE AND METHOD

(71) Applicant: Taiwan Semiconductor Manufacturing Co., Ltd., Hsinchu (TW)

(72) Inventors: Tung Ying Lee, Hsinchu (TW); Yu Chao Lin, Hsinchu (TW); Shao-Ming Yu, Zhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/992,210

(22) Filed: Aug. 13, 2020

(65) Prior Publication Data

US 2021/0336138 A1     Oct. 28, 2021

Related U.S. Application Data

(60) Provisional application No. 63/016,337, filed on Apr. 28, 2020.

(51) Int. Cl.
     *H01L 45/00*      (2006.01)
(52) U.S. Cl.
     CPC ...... *H01L 45/1675* (2013.01); *H01L 45/1253* (2013.01); *H01L 45/144* (2013.01); *H01L 45/1608* (2013.01)
(58) Field of Classification Search
     CPC ....................................................... H01L 45/00
See application file for complete search history.

(56) References Cited

U.S. PATENT DOCUMENTS

| | | | |
|---|---|---|---|
| 7,129,133 B1 | 10/2006 | Avanzino et al. | |
| 9,859,336 B1 | 1/2018 | Tseng et al. | |
| 2006/0125108 A1 | 6/2006 | Gutsche et al. | |
| 2007/0075351 A1* | 4/2007 | Schulz | H01L 21/845 257/314 |
| 2010/0051893 A1* | 3/2010 | Kim | H01L 45/144 257/2 |
| 2012/0280199 A1 | 11/2012 | Takagi | |
| 2013/0064001 A1 | 3/2013 | Terai | |
| 2014/0124726 A1* | 5/2014 | Oh | H01L 27/2409 257/4 |
| 2015/0090954 A1* | 4/2015 | Li | H01L 45/144 257/4 |
| 2019/0035734 A1 | 1/2019 | Ho et al. | |
| 2019/0363136 A1 | 11/2019 | Wu | |

(Continued)

FOREIGN PATENT DOCUMENTS

| | | |
|---|---|---|
| DE | 102004059428 A1 | 6/2006 |
| JP | 2013062408 A | 4/2013 |

(Continued)

*Primary Examiner* — Mounir S Amer
(74) *Attorney, Agent, or Firm* — Slater Matsil, LLP

(57) ABSTRACT

A method includes forming a dielectric layer over a substrate, the dielectric layer having a top surface; etching an opening in the dielectric layer; forming a bottom electrode within the opening, the bottom electrode including a barrier layer; forming a phase-change material (PCM) layer within the opening and on the bottom electrode, wherein a top surface of the PCM layer is level with or below the top surface of the dielectric layer; and forming a top electrode on the PCM layer.

20 Claims, 17 Drawing Sheets

(56) References Cited

U.S. PATENT DOCUMENTS

| 2020/0005863 | A1 | 1/2020 | Grobis et al. |
| 2020/0091427 | A1 | 3/2020 | Ando et al. |
| 2020/0098897 | A1 | 3/2020 | Tapily et al. |

FOREIGN PATENT DOCUMENTS

| KR | 20080011791 | | 2/2008 |
| KR | 20100110631 | | 10/2010 |
| KR | 20190013413 | A | 2/2019 |

\* cited by examiner

PHASE-CHANGE MEMORY DEVICE AND METHOD

PRIORITY CLAIM AND CROSS-REFERENCE

This application claims the benefit of U.S. Provisional Application No. 63/016,337, filed on Apr. 28, 2020, which application is hereby incorporated herein by reference.

BACKGROUND

Semiconductor memories are used in integrated circuits for electronic applications, including radios, televisions, cell phones, and personal computing devices, as examples. One type of semiconductor memory is phase-change random access memory (PCRAM), which involves storing values in phase change materials, such as chalcogenide materials. Phase change materials can be switched between an amorphous phase (in which they have a low resistivity) and a crystalline phase (in which they have a high resistivity) to indicate bit codes. A PCRAM cell typically includes a phase change material (PCM) element between two electrodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
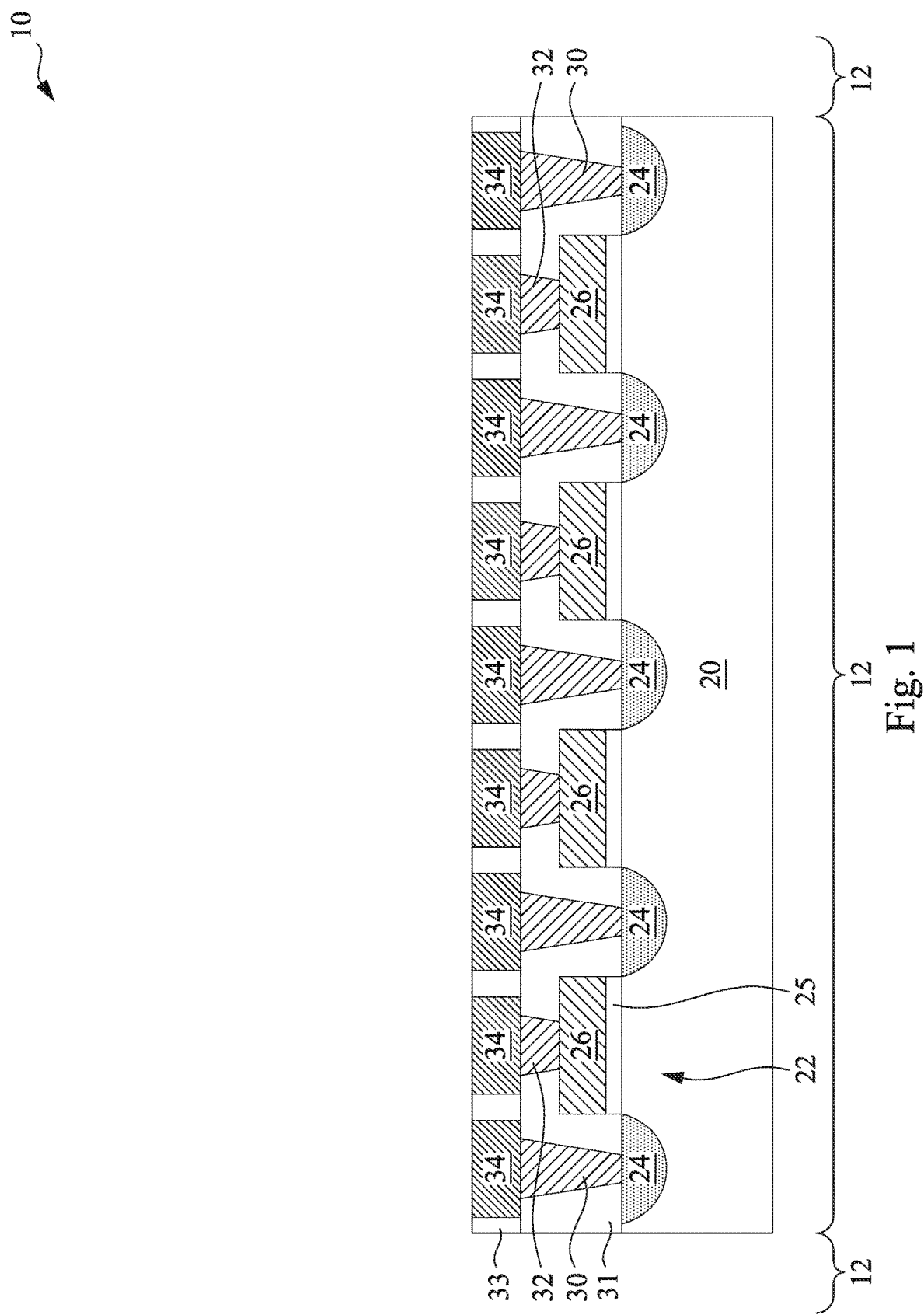
FIGS. 1 through 5 illustrate the cross-sectional views of intermediate stages in the formation of Phase-Change Random Access Memory (PCRAM) cells, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments of the present disclosure, a phase-change random access memory (PCRAM) structure is formed comprising multiple PCRAM cells, which may be arranged in an array. The PCRAM cells include a bottom electrode, a phase-change material (PCM) layer on the bottom electrode, and a top electrode on the PCM layer. In some embodiments, the bottom electrode is formed by etching an opening in a dielectric layer and then depositing a barrier layer material and a conductive material in the opening. An etch back process is performed to recess the barrier layer material and the conductive material within the opening, the remaining barrier layer material and conductive material forming the bottom electrode. The etch back process may be, for example, an atomic layer etching (ALE) process or the like, and the etch back process can remove most or all of the barrier layer material from sidewalls of the opening above the recessed bottom electrode. Removing the barrier layer material from sidewalls of the opening can reduce thermal and electrical leakage of the PCRAM cell. The PCM is deposited on the bottom electrode, and another etch back process is performed to remove excess PCM material, the remaining PCM forming the PCM layer. The etch back process may recess the PCM below a top surface of the dielectric layer. The top electrode is then formed on the PCM layer. By forming a PCM layer that is surrounded by the dielectric layer, the PCRAM layer can have improved thermal insulation, and thus the PCRAM layer can be heated more efficiently during operation, which can improve the efficiency and performance of the PCRAM cell.

Figure 13:
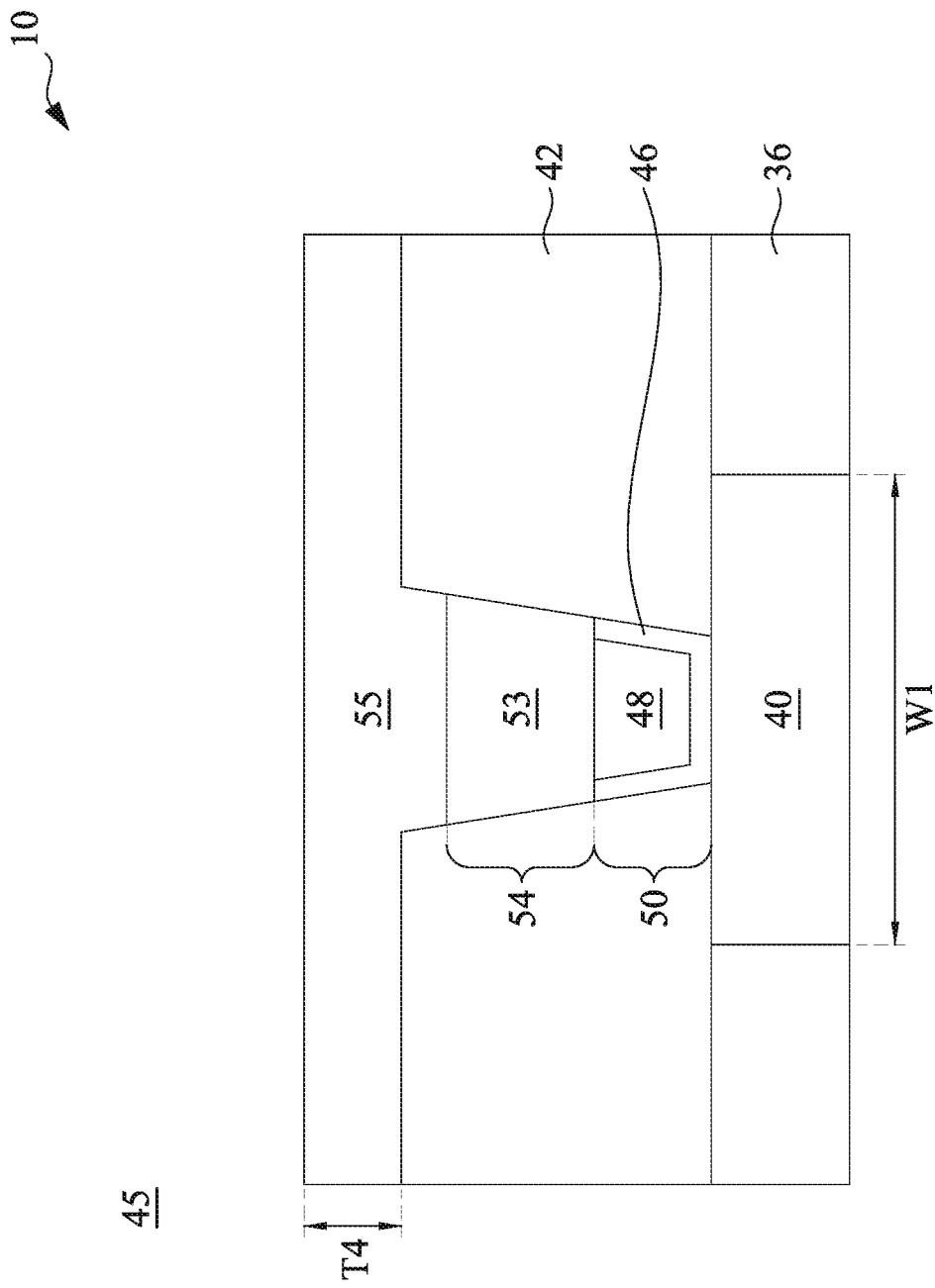
Figure 14:
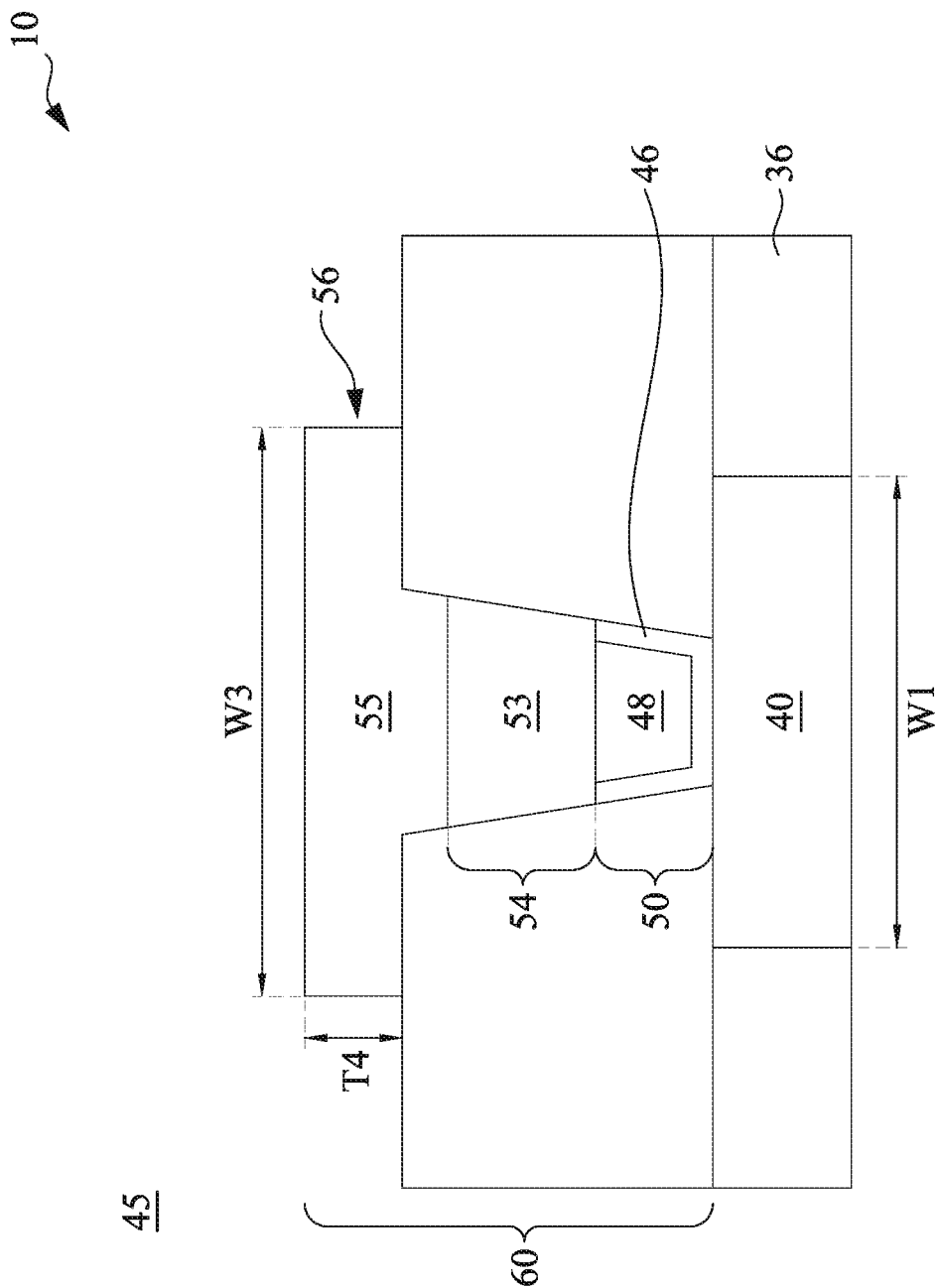
Figure 15:
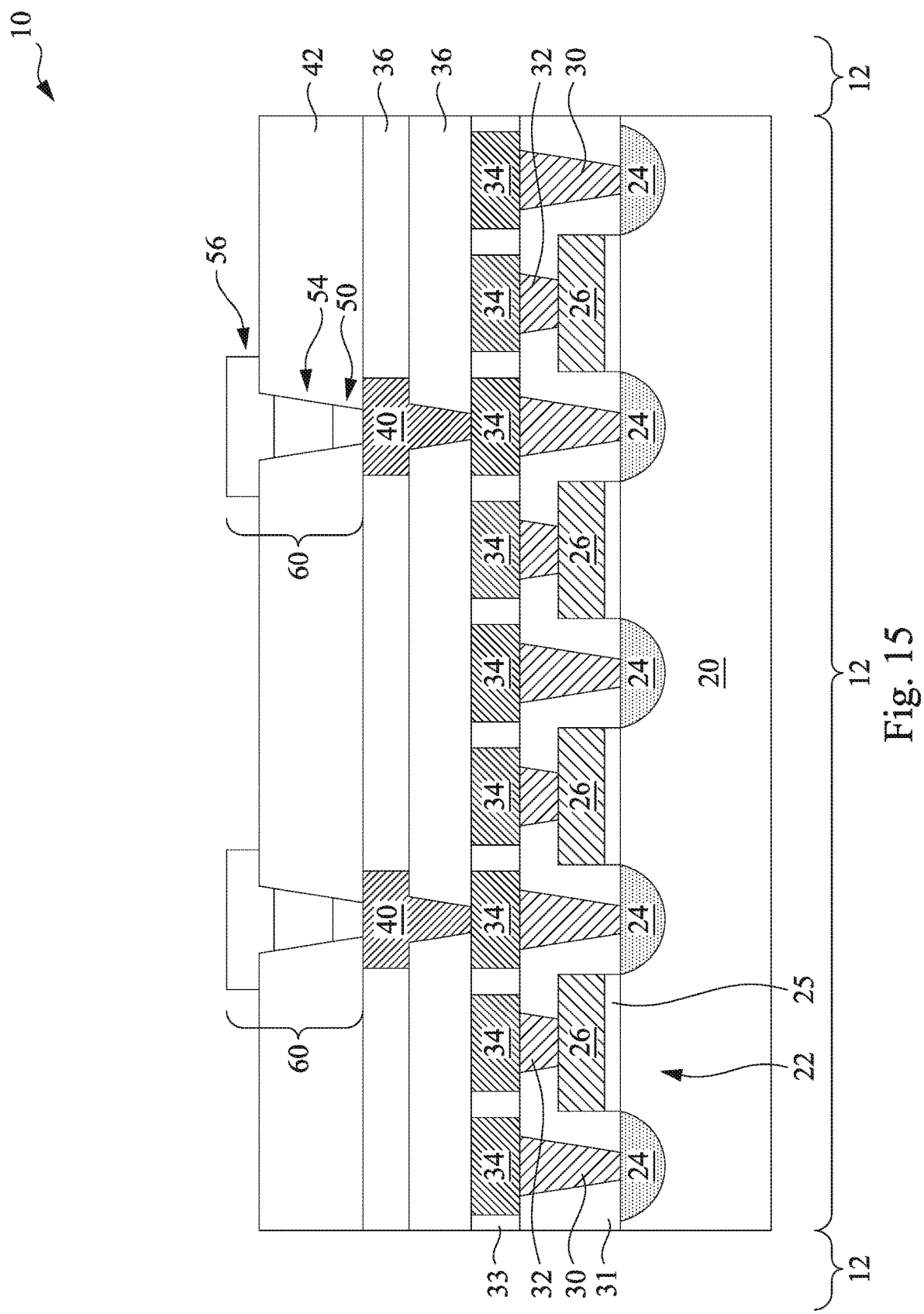
FIGS. 15 and 16 illustrate cross-sectional views of intermediate stages in the formation of PCRAM cells, in accordance with some embodiments.

FIGS. 1-8 and 11-16 are cross-sectional views illustrating a device region 12 of a wafer 10 in which a PCRAM cells 60 are formed (see FIGS. 14 and 15). FIGS. 5-8 and 11-14 show a magnified portion 45 of the structure. FIG. 9 shows a process flow for an electrode etch back process 100, and FIGS. 10A-D shows example bottom electrodes 50 formed using the electrode etch back process 100. FIG. 17 illustrates a schematic of a PCRAM array 70 that includes multiple PCRAM cells 60.

FIG. 1 illustrates a cross-sectional view of a device region 12 of a wafer 10, in accordance with some embodiments. The device regions 12 are different regions of the wafer 10 that are singulated in subsequent steps to form a plurality of device regions 12 that each comprise PCRAM structures, such as PCRAM cells 60 (see FIGS. 14-15) or a PCRAM array 70 including multiple PCRAM cells 60 (see FIG. 17). The wafer 10 includes a semiconductor substrate 20 which may be, for example, silicon, doped or undoped, or an active layer of a semiconductor-on-insulator (SOI) substrate. The semiconductor substrate 20 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 20 has an active surface (e.g., the surface facing upwards in FIG. 1), sometimes called a front side, and an inactive surface (e.g., the surface facing downwards in FIG. 1), sometimes called a back side.

Devices are formed at the active surface of the semiconductor substrate 20. The devices may include active devices and/or passive devices. For example, the devices may comprise transistors, diodes, capacitors, resistors, or the like, and may be processed according to applicable manufacturing processes. As an example, FIG. 1 illustrates access transistors 22 formed on the front surface of semiconductor substrate 20, which are used to access (or "select") PCRAM cells 60 of the device region 12 (see FIG. 16). In accordance with some embodiments, the access transistors 22 include gate dielectrics 25, gate electrodes 26, source/drain regions 24, source/drain contact plugs 30, and gate contact plugs 32. In some embodiments, the source/drain regions 24 may extend into semiconductor substrate 20.

As shown in FIG. 1, one or more inter-layer dielectric (ILD) layers 31 are formed on the semiconductor substrate 20, and electrically conductive features such as the contact plugs 30/32 are formed in the ILD layers 31 to electrically connect to the access transistors 22. The contact plugs 30/32 may be formed, for example, of tungsten, cobalt, nickel, copper, silver, gold, aluminum, the like, or combinations thereof. The ILD layers 31 may be formed of any suitable dielectric material, for example, an oxide such as silicon oxide, phosphosilicate glass (PSG), borosilicate glass (BSG), boron-doped phosphosilicate glass (BPSG), undoped silicate glass (USG), or the like; a nitride such as silicon nitride, or the like; a low-k dielectric material; or the like, or combinations thereof. The ILD layer(s) may be formed by any suitable deposition process, such as spin coating, physical vapor deposition (PVD), chemical vapor deposition (CVD), the like, or a combination thereof. The contact plugs 30/32 or other electrically conductive features in the ILD layer(s) 31 may be formed through any suitable process, such as deposition, damascene (e.g., single damascene, dual damascene, etc.), the like, or combinations thereof. In some embodiments, the ILD layer(s) 31 include one or more inter-metal dielectric (IMD) layers.

Still referring to FIG. 1, an inter-metal dielectric (IMD) layer 33 and metal lines 34 are formed over the ILD layer(s) 31, in accordance with some embodiments. The IMD layer 33 may be formed of any suitable dielectric material, for example, an oxide such as silicon oxide, PSG, BSG, BPSG, USG, or the like; a nitride such as silicon nitride or the like; or the like, or combinations thereof. The IMD layer 33 may be formed by any suitable deposition process, such as spin coating, PVD, CVD, the like, or a combination thereof. The IMD layer 33 may be a layer formed of a low-k dielectric material having a k-value lower than about 3.0.

Metal lines 34 are formed in the IMD layer 33 and are electrically coupled to the access transistors 22 (e.g., through the contact plugs 30/32). In some embodiments, some or all of the metal lines 34 may be used as word lines (WL) that are connected to columns of PCRAM cells 60 in a PCRAM array 70, described in greater detail below for FIG. 17. In accordance with some embodiments, the metal lines 34 include diffusion barrier layers and conductive material over the diffusion barrier layers. As an example process for forming the metal lines 34, openings (not shown in the figures) may be formed in the IMD layer 33 using, e.g., a suitable etching process. The openings expose underlying conductive features, such as the contact plugs 30/32. The diffusion barrier layers may be formed of tantalum nitride, tantalum, titanium nitride, titanium, cobalt-tungsten, the like, or combinations thereof, and may be formed in the openings by a deposition process such as atomic layer deposition (ALD) or the like. The conductive material may include copper, aluminum, tungsten, silver, the like, or combinations thereof, and may be formed over the diffusion barrier layers in the openings using an electro-chemical plating process, CVD, ALD, PVD, the like, or a combination thereof. In an embodiment, the conductive material is copper, and the diffusion barrier layers are thin barrier layers that prevent the copper from diffusing into the IMD layer 33. After formation of the diffusion barrier layers and the conductive material, excess of the diffusion barrier layers and conductive material may be removed by, for example, a planarization process such as a chemical mechanical polish (CMP) process. The remaining diffusion barrier layer and conductive material form the metal lines 34 in the IMD layer 33. Other techniques than this may be used to form the metal lines 34.

Figure 2:
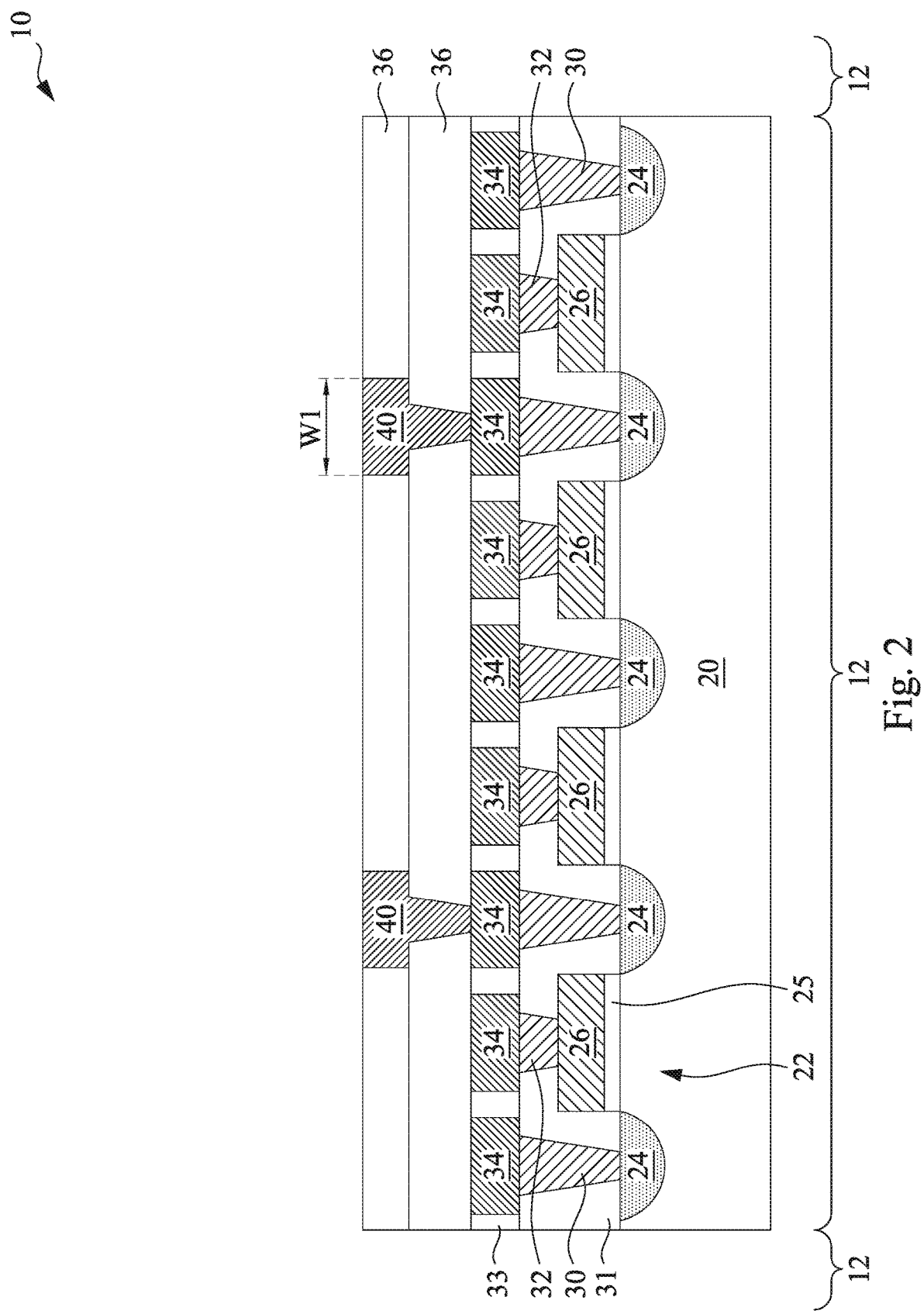

FIG. 2 illustrates the formation of dielectric layers 36 and metallization layers 40 over and electrically connecting to the metal lines 34, in accordance with some embodiments. The metallization layers 40 provide additional interconnection (e.g., between the metal lines 34, the access transistors 22, or the like). The dielectric layers 36 may be considered IMD layers in some embodiments, and may be formed of dielectric material(s) similar to those described above for the IMD layer 33. The metallization layer 40 (e.g., metallization patterns) may include metal lines and vias formed in the dielectric layers 36. The metallization layer 40 may formed using a damascene process, such as a single damascene process, a dual damascene process, or the like. For example, the metallization layer 40 may be formed by etching into a dielectric layer 36 to form openings, filling the openings with a conductive material, and then performing a planarization process such as a CMP process or a grinding process to remove excess conductive material. The metallization layer 40 may be formed in a similar manner as the metal lines 34, in some embodiments, or may be formed using another suitable technique. It is appreciated that although one metallization layer 40 (including metal lines and underlying vias) is illustrated in FIG. 2, in other embodiments there may be additional metallization layers formed in additional dielectric layers over the dielectric layers 36. Alternatively, the subsequently formed PCRAM cells 60 (FIG. 14) may be formed directly on the metal lines 34 without forming the metallization layers 40. In some embodiments, the metal lines 34 and/or the contact plugs 30/32 are also considered part of the metallization layers. In some embodiments, metal line regions of the metallization layer 40 are formed having a width W1 in the range of about 100 nm to about 300 nm.

Figure 3:
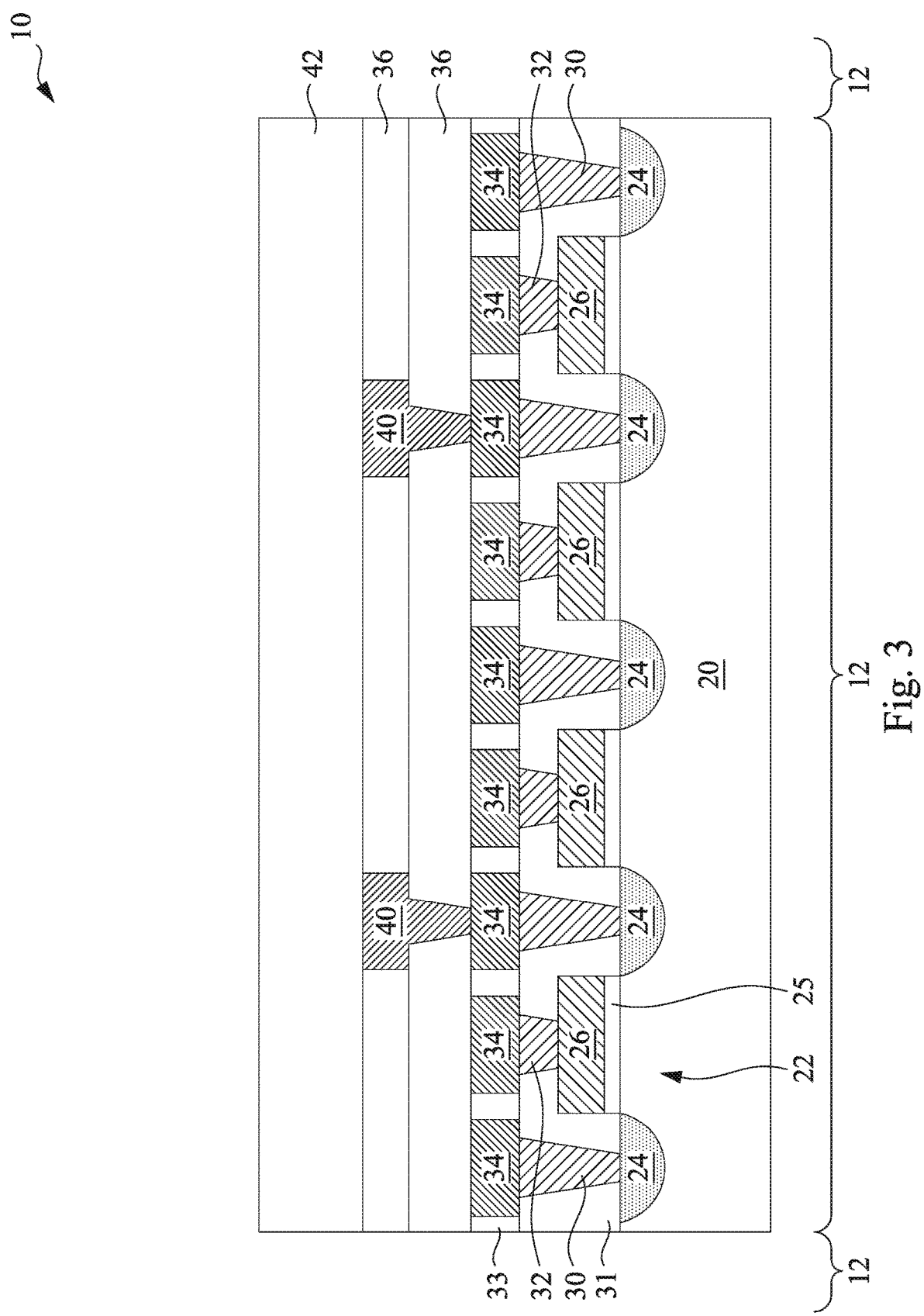
Figure 4:
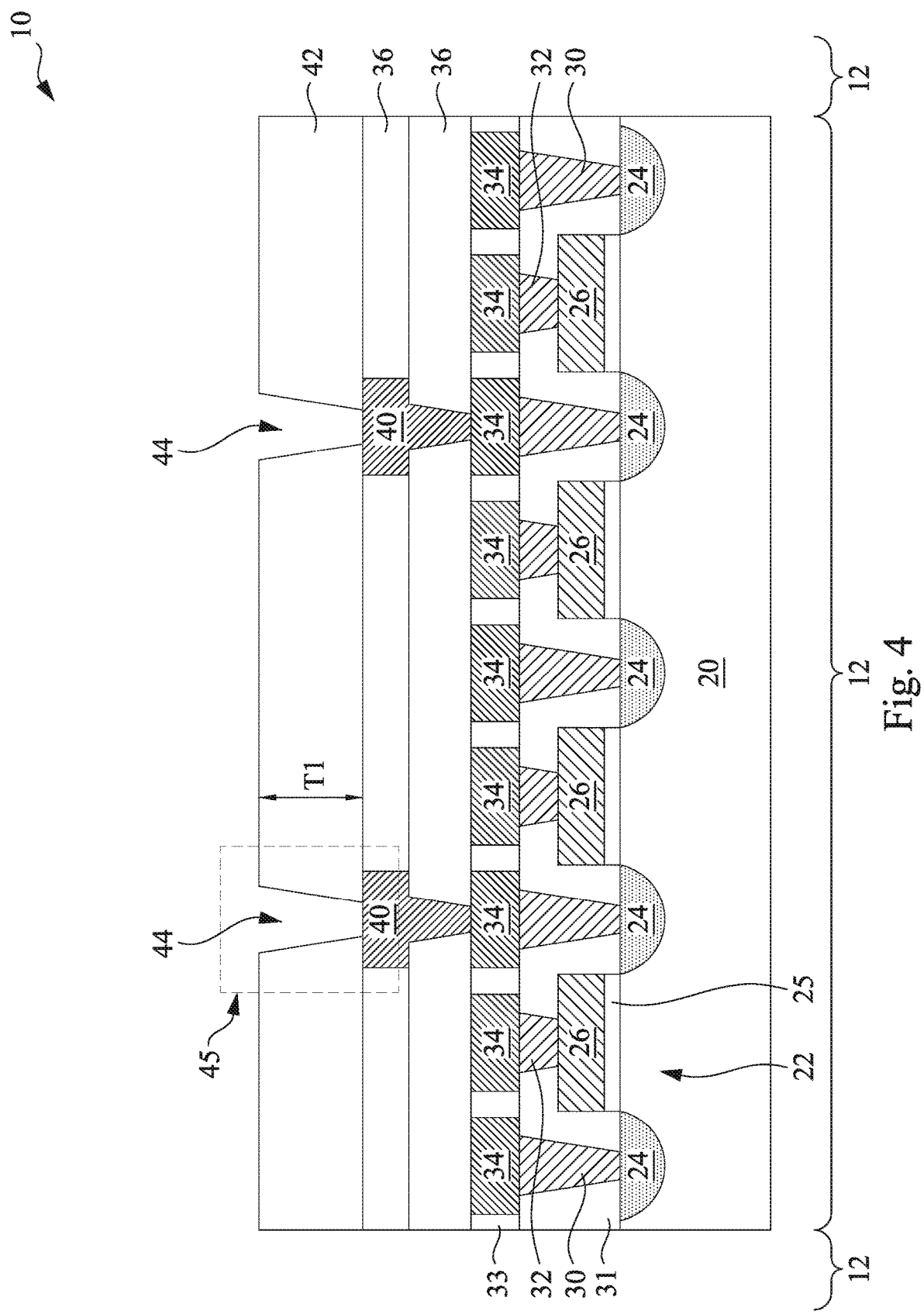

FIGS. 3 through 14 are various views of intermediate stages in the manufacturing of PCRAM cells 60 of a device region 12 (see FIG. 15), in accordance with some embodiments. FIGS. 3 and 4 show the same cross-section shown in FIGS. 1 and 2, and FIGS. 5-8 and FIGS. 10A-D and 11-15 illustrate a magnified portion 45 of the structure shown in FIG. 4.

Turning to FIG. 3, an IMD layer 42 is formed over the dielectric layers 36 and metallization layer(s) 40, in accordance with some embodiments. In some embodiments, an etch stop layer (not shown in the figures) is formed on the dielectric layers 36 and metallization layer(s) 40 prior to forming the IMD layer 42. The etch stop layer may be formed of one or more layers of dielectric materials such as aluminum nitride, aluminum oxide, silicon oxide, silicon nitride, silicon oxynitride, silicon carbide, the like, or a combination thereof. The etch stop layer may be formed by CVD, PVD, ALD, a spin-on-dielectric process, the like, or a combination thereof. In some embodiments, the IMD layer 42 is formed of a tetraethyl orthosilicate (TEOS) oxide (e.g., silicon oxide deposited using, e.g., a CVD process with TEOS as a precursor). In some embodiments, the IMD layer 42 may be formed using PSG, BSG, BPSG, USG, fluorosilicate glass (FSG), silicon oxide, silicon carbide, silicon oxynitride, silicon oxycarbide, SiOCH, a flowable oxide, a porous oxide, the like, or combinations thereof. The IMD layer 42 may also be formed of a low-k dielectric material with a k value lower than about 3.0, for example. In some embodiments, the IMD layer 42 is formed having a thickness T1 in the range of about 60 nm to about 1000 nm. Other thicknesses are possible.

Figure 5:
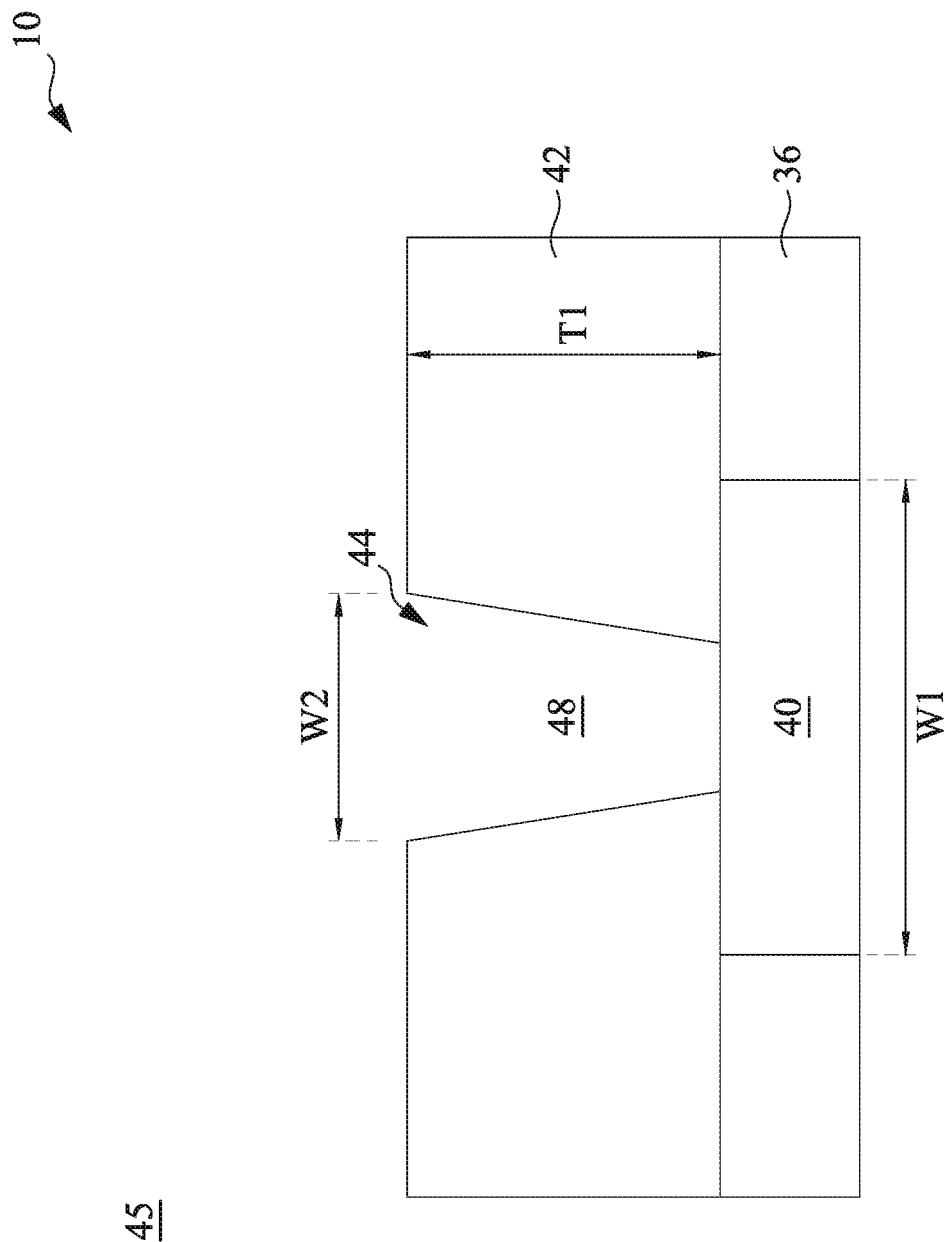

In FIGS. 4 and 5, openings 44 are patterned in the IMD layer 42, in accordance with some embodiments. FIG. 5 shows a magnified portion 45 of the cross-sectional view shown in FIG. 4. The openings 44 expose the topmost metallization layer 40 so that the bottom electrodes 50 of the PCRAM cells 60 that are subsequently formed in the openings 44 (see FIG. 14) make electrical connection to the metallization layer(s) 40. In some embodiments in which the metallization layer(s) 40 are not formed, the IMD layer 42 is formed over the metal lines 34 and the openings 44 expose the metal lines 34. The openings 44 may be formed using acceptable photolithography and etching techniques. For example, a mask layer (not pictured) such as a hard mask layer or a photoresist layer (e.g., a single-layer photoresist, a tri-layer photoresist, or the like) may be formed over the IMD layer 42 and patterned. The IMD layer 42 may then be etched using the patterned mask layer as an etching mask, forming the openings 44. The IMD layer 42 may be etched using an anisotropic etching process such as a suitable dry etching process. One or more etching processes may be performed, and the openings 44 may extend through an etch stop layer (if present) over the metallization layer 40. After forming the openings 44, remaining portions of the mask layer may then be removed using e.g., an ashing process, an etching process, or another suitable process.

The openings 44 may have tapered sidewalls, such as shown in FIGS. 4-5, or the openings 44 may have substantially vertical sidewalls. In some embodiments, the openings 44 are formed having a width W2 in the range of about 40 nm to about 80 nm. Other widths are possible. In some embodiments, the upper region of the openings 44 may have a width greater than the width of the lower region of the openings 44, such as shown in FIGS. 4-5. In other embodiments, the openings 44 have a substantially constant width (e.g., width W2). In some embodiments, the width W2 of the openings 44 may be less than or about the same as the width W1 of the underlying metallization layer 40. In some embodiments, the openings 44 may have a width:height aspect ratio (e.g., the ratio W2:T1) that is in the range of about 1:8 to about 1:15.

Figure 6:
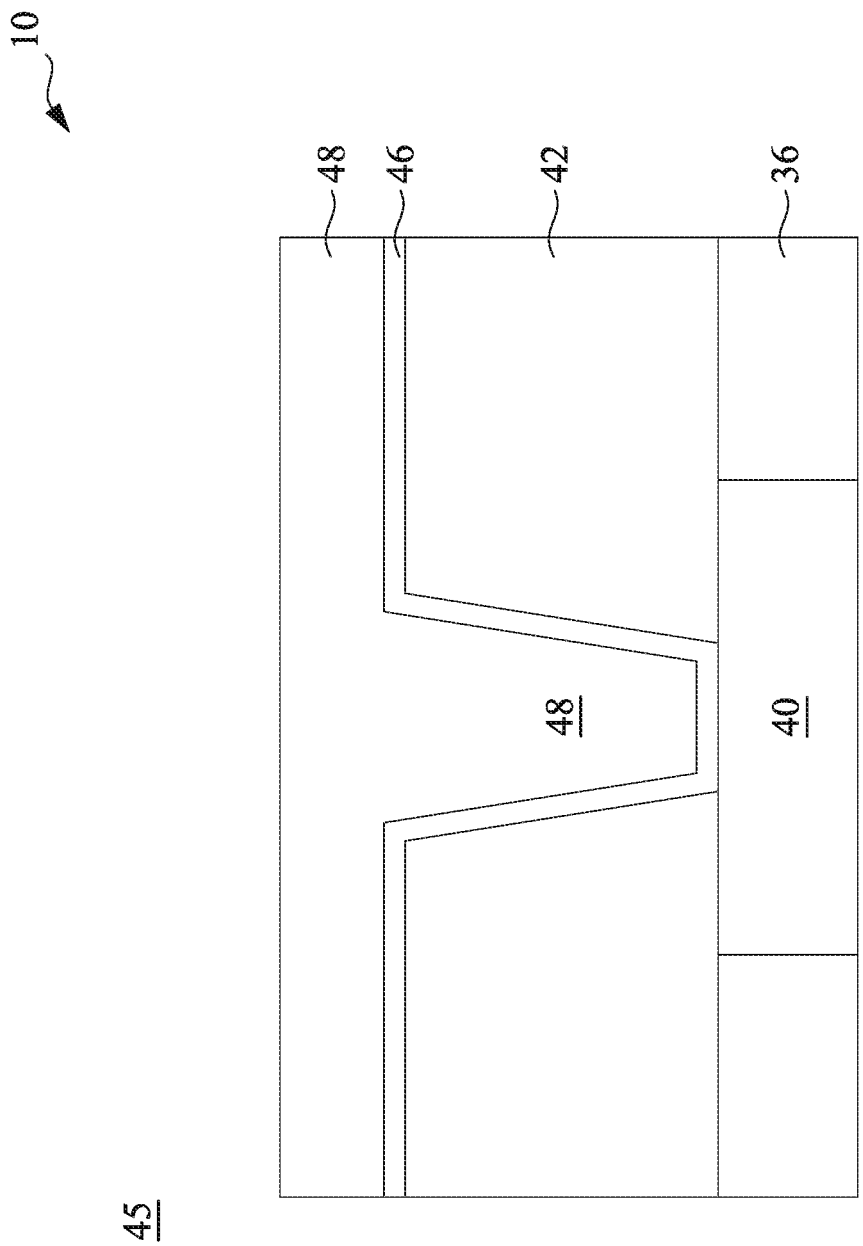
FIGS. 6 through 8 illustrate cross-sectional views of intermediate stages in the formation of a PCRAM cell, in accordance with some embodiments.

FIGS. 6 through 10D illustrate the formation of a bottom electrode 50 of a PCRAM cell 60, in accordance with some embodiments. In FIG. 6, a barrier layer 46 and a conductive material 48 are deposited over the IMD layer 42 and within the opening 44, in accordance with some embodiments. The barrier layer 46 may be conformally deposited on the IMD layer 42, on sidewalls of the openings 44, and on the metallization layer 40. In some embodiments, the barrier layer 46 is formed of one or more conductive materials such as titanium, titanium nitride, tantalum, tantalum nitride, cobalt, the like, or a combination thereof. The barrier layer 46 may be formed using one or more suitable deposition processes, such as PVD, CVD, ALD, or the like. In some embodiments, the barrier layer 46 is a layer of tantalum nitride deposited using an ALD process or another suitable process. In some embodiments, barrier layer 46 within the openings 44 may be formed having a thickness in the range of about 20 nm to about 80 nm. Other thicknesses are possible.

After depositing the barrier layer 46, a conductive material 48 is deposited over the barrier layer 46, filling the openings 44. In some embodiments, the conductive material 48 is formed of one or more conductive materials such as titanium, titanium nitride, tantalum, aluminum, tungsten, platinum, nickel, chromium, ruthenium, or the like. The conductive material 48 may be deposited using CVD, PVD, ALD, electro-chemical plating, electroless plating, or the like. In some embodiments, the conductive material 48 is titanium nitride deposited using PVD.

Figure 7:
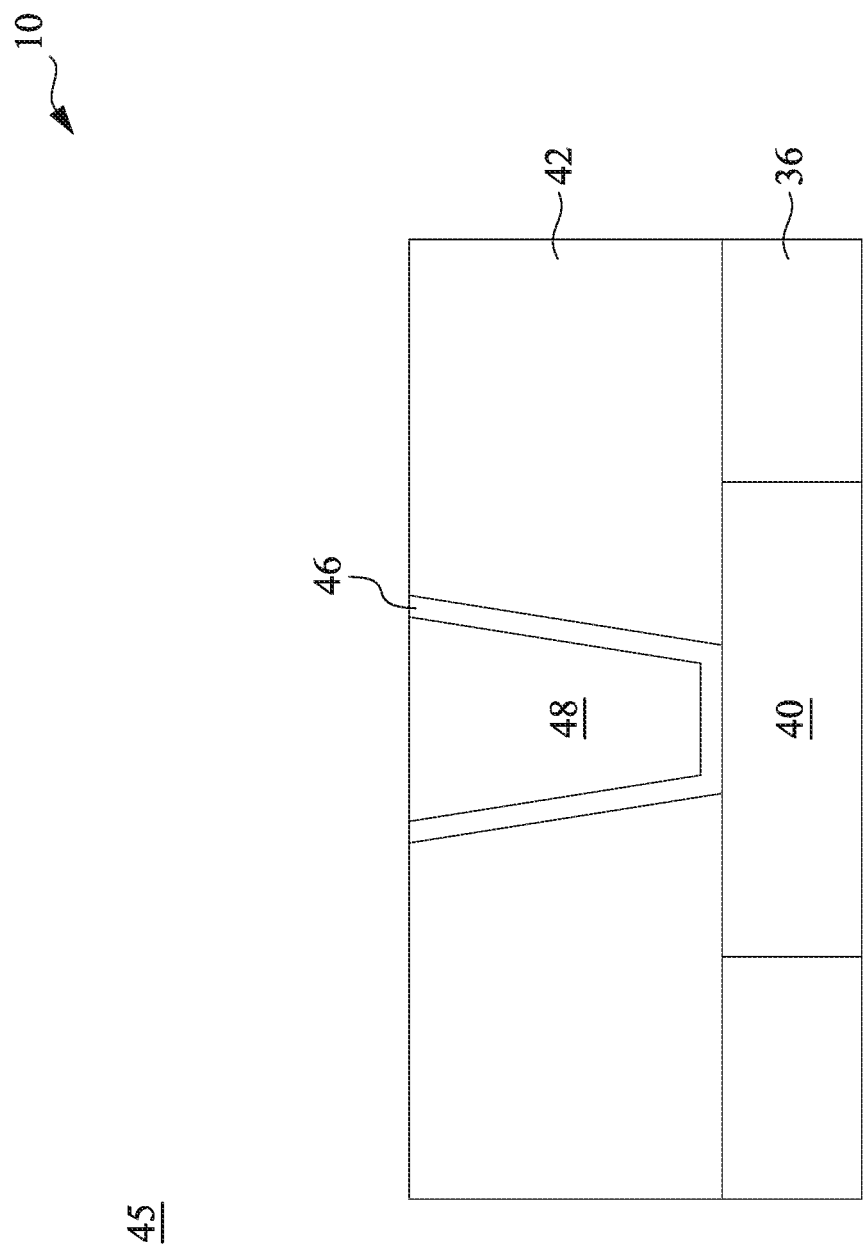

In FIG. 7, a planarization process is performed to remove excess barrier layer 46 and conductive material 48 from the IMD layer 42, in accordance with some embodiments. The planarization process may include a CMP process or a mechanical grinding process, for example. The planarization may level the top surfaces of the IMD layer 42, the barrier layer 46, and the conductive material 48.

Figure 8:
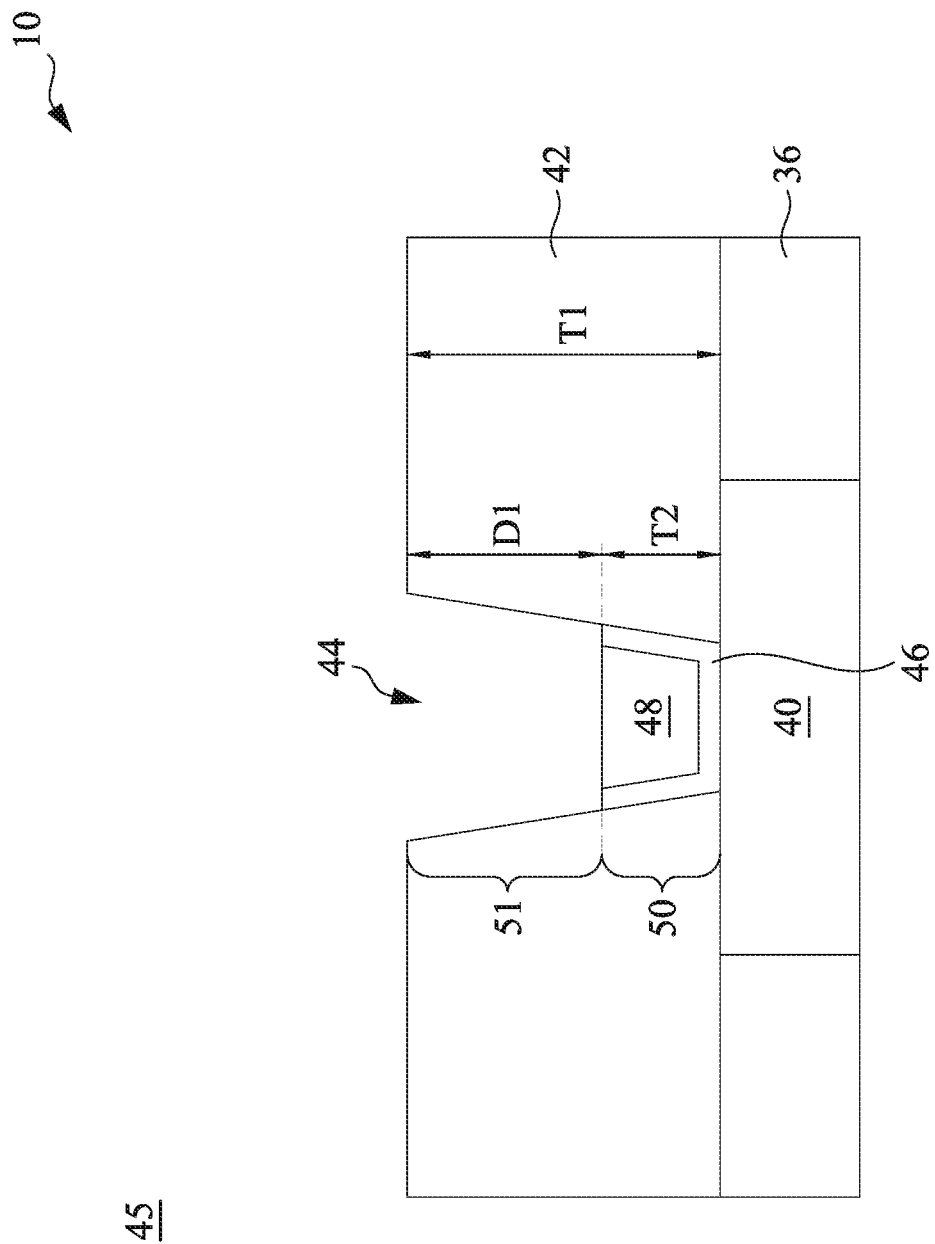
Figure 9:
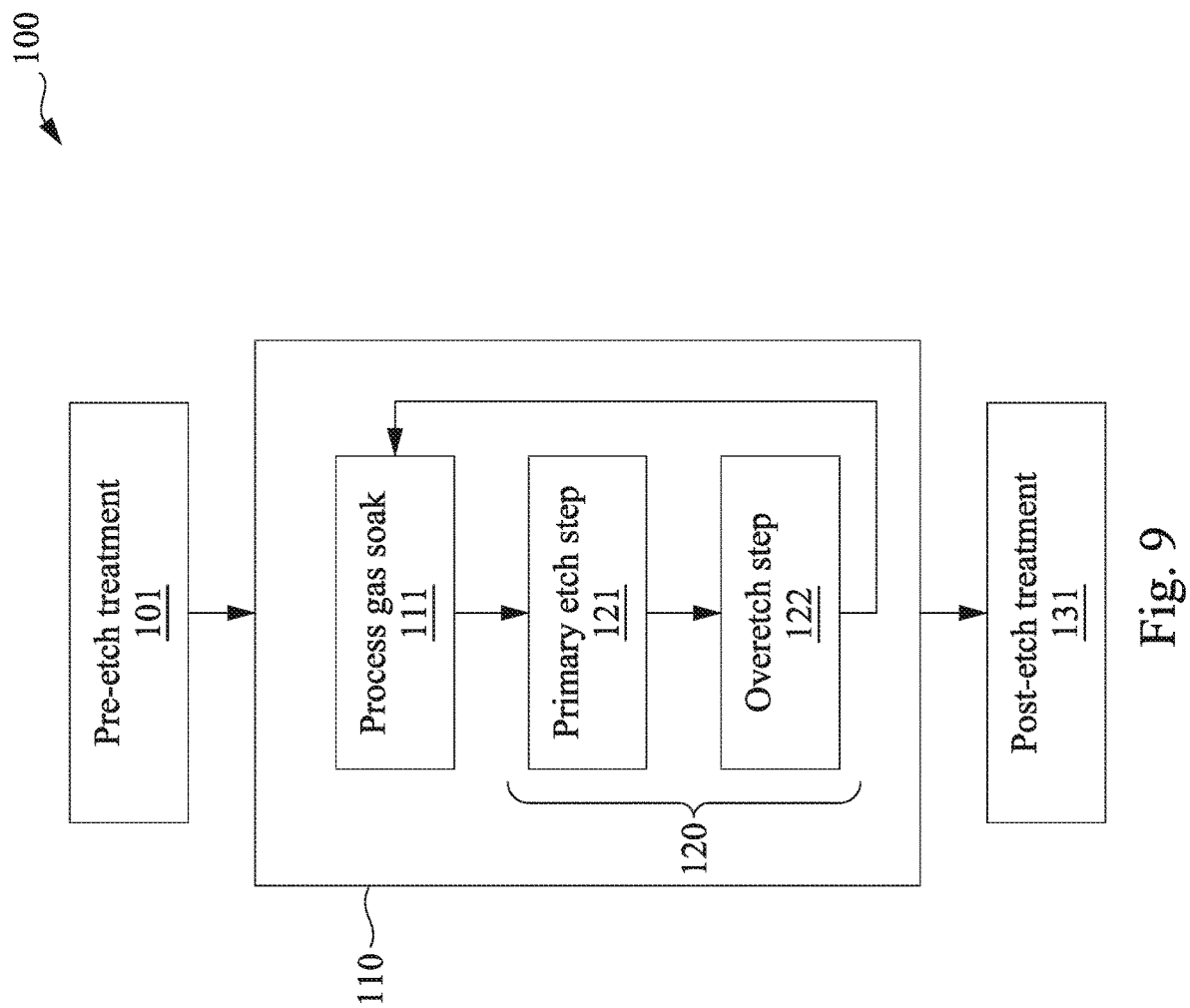
FIG. 9 illustrates a process flow for an electrode etch back process, in accordance with some embodiments.

In FIG. 8, an electrode etch back process is performed on the barrier layer 46 and the conductive material 48 to form the bottom electrodes 50, in accordance with some embodiments. The electrode etch back process etches the barrier layer 46 and the conductive material 48 to recess the barrier layer 46 and conductive material 48 within the openings 44. In some embodiments, the electrode etch back process may selectively etch the material of the barrier layer 46 and the material of the conductive material 48 over the material of the IMD layer 42. In this manner, the barrier layer 46 may be removed from sidewalls of the openings 44 without significantly etching the sidewalls of the openings 44. An example electrode etch back process 100 is described in greater detail below for FIG. 9. The region within the openings 44 corresponding to the removed barrier layer 46 and conductive material 48 is indicated in FIG. 8 as recessed region 51. After performing the electrode etch back process, the remaining barrier layer 46 and conductive material 48 within the openings 44 form the bottom electrodes 50 of the PCRAM cells 60 (see FIG. 14). For example, the electrode etch back process may recess the barrier layer 46 and the conductive material 48 a depth D1 from a top surface of the IMD layer 42, which forms recessed regions 51 of depth $D_1$. After performing the electrode etch back process, the remaining barrier layer 46 and conductive material 48 forms bottom electrodes 50 having a thickness T2 above the underlying metallization layer 40.

In some embodiments, the thickness T2 of the bottom electrodes 50 may be in the range of about 10 nm to about 30 nm. Other thicknesses are possible. In some embodiments, the thickness T2 of the bottom electrodes 50 may be between about 25% and about 50% of the thickness T1 of the IMD layer 42, though other proportions are possible. In some embodiments, the ratio of the thickness T2 to the depth D1 of the recessed region 51 (e.g., thickness T2:depth D1) may be between about 1:1 and about 1:3, though other ratios are possible. In some embodiments, the thickness T3 of the subsequently-formed phase-change material (PCM) layers 54 (see FIG. 12) is determined by the thickness T2 of the bottom electrodes 50. In this manner, by controlling the depth D1 of the electrode etch back process, the relative or absolute sizes of the bottom electrodes 50 and the PCM layers 54 may be controlled, and thus the operational characteristics of the PCRAM cells 60 may be controlled. For example, the heating characteristics of the bottom electrodes 50 during operation of the PCRAM cells 60 may be controlled by controlling the thickness T2. Additionally, FIG. 8 shows the bottom electrode 50 as having a flat top surface, but in other embodiments, the bottom electrodes 50 may have a convex surface, concave surface, irregular surface, or combinations thereof, described below in greater detail for FIGS. 10A-D.

By forming the bottom electrodes 50 using an electrode etch back process as described herein, the subsequently formed PCM layers 54 (see FIG. 12) may be confined within the IMD layer 42, which can improve heat transfer efficiency and thus improve performance and power consumption of the PCRAM cells 60. Additionally, the electrode etch back process removes at least some of the barrier layer 46 from sidewalls of the openings 44 as the barrier layer 46 is recessed. In this manner, excess barrier layer 46 within the openings 44 that is not part of the bottom electrodes 50 may be removed. For example, the electrode etch back process may partially or completely remove the barrier layer 46 within the recessed region 51, which may expose the sidewalls of the openings 44 within the recessed region 51. By removing the excess barrier layer 46 within the openings 44, electrical and/or thermal leakage due to the presence of excess barrier layer 46 may be reduced, which can improve both electrical performance and heat transfer efficiency of the PCRAM cells 60.

FIG. 9 illustrates a process flow for an electrode etch back process 100, in accordance with some embodiments. The electrode etch back process 100 may be used, for example, to etch the barrier layer 46 and the conductive material 48 to form a bottom electrodes 50, as shown in FIG. 8. The electrode etch back process 100 includes a pre-etch treatment 101, an etching process 110, and a post-etch treatment 131. In some embodiments, the etching process 110 is an atomic layer etching (ALE) process or the like. In some embodiments, the electrode etch back process 100 selectively etches the barrier layer 46 and conductive material 48 over the IMD layer 42. The electrode etch back process 100 is an example electrode etch back process, and other process parameters, process gases, or etching techniques may be used.

Prior to performing the etching process 110, the pre-etch treatment 101 may be performed to remove metal oxides from surfaces (e.g., surfaces of the structure shown in FIG. 7). For example, the pre-etch treatment 101 may remove titanium oxide or tantalum oxide from the exposed surfaces of the barrier layer 46 or conductive material 48. Removing the metal oxides using the pre-etch treatment 101 can allow for more uniform etching during the etching process 100. A purge may be performed after the pre-etch treatment 101 to remove process gases, reaction products, or the like.

In some embodiments, the pre-etch treatment 101 includes a plasma process, such as a plasma etch. The plasma process may include flowing one or more process gases into a process chamber and then igniting the one or more process gases into a plasma. For example, the pre-etch treatment 101 may include a plasma process using one or more process gases such as $CH_4$, $CL_2$, Ar, the like, other gases, or combinations thereof. For example, a mixture of $CH_4$, $Cl_2$, and Ar may be used that has between about 3 sccm and about 10 sccm $CH_4$, between about 30 sccm and about 100 sccm $Cl_2$, and/or between about 50 sccm and about 100 sccm Ar, in some embodiments. Other mixtures are possible. The plasma process may be performed using a plasma source power in the range of about 150 W to about 400 W, using a bias power in the range of about 30 W to about 60 W. In some embodiments, no bias power is applied. The pre-etch treatment 101 may be performed using a pressure in the range of about 3 mTorr to about 10 mTorr, with a process gas flow rate in the range of about 100 sccm to about 250 sccm. Other process gases or process parameters are possible.

In some embodiments, the etching process 110 includes a process gas soak 111 followed by one or more etching cycles 120. For example, during the process gas soak 111, the structure may be exposed to a process gas such as $Cl_2$ or other gases. In some embodiments, the process gas may be flowed at a flow rate in the range of about 100 sccm to about 300 sccm, though other flow rates are possible. In some embodiments, during the process gas soak 111, the process gas is not ignited into a plasma. A purge may be performed after the etching process 110 to remove process gases, reaction products, or the like.

After the process gas soak 111, one or more etching cycles 120 are performed. In some embodiments, each etch cycle 120 comprises a primary etch step 121 and an overetch step 122. The primary etch step 121 and the overetch step 122 may each include flowing one or more process gases into a process chamber and then igniting the one or more process gases into a plasma. The primary etch step 121 may include a plasma etch using one or more process gases such as $Cl_2$, $BCl_3$, Ar, He, the like, other gases, or combinations thereof. For example, a mixture of $Cl_2$, $BCl_3$, Ar, and He may be used that has between about 30% and about 70% $Cl_2$, between about 20% and about 60% $BCl_3$, between about 20% and about 50% Ar, and/or between about 20% and about 50% He may be used, in some embodiments. Other mixtures are possible. The primary etch step 121 may be performed using a plasma source power in the range of about 250 W to about 400 W, and may be performed using a bias power in the range of about 0 W to about 30 W. In some embodiments, the bias power may be used with an on-off duty cycle between about 20% and about 80% or at a frequency in the range of about 100 Hz to about 1000 Hz. The primary etch step 121 may be performed using a pressure in the range of about 3 mTorr to about 10 mTorr, with a process gas flow rate in the range of about 300 sccm to about 1000 sccm. In some embodiments, the primary etch step 121 may be performed for a duration of time in the range of about 100 seconds to about 500 seconds. Other process gases or process parameters are possible.

The overetch step 122 may include a plasma etch using one or more process gases such as $Cl_2$, $BCl_3$, Ar, He, the like, other gases, or combinations thereof. For example, a mixture of $Cl_2$, $BCl_3$, Ar, and He may be used that has between about 30% and about 70% $Cl_2$, between about 20% and about 60% $BCl_3$, between about 20% and about 50% Ar, and/or between about 20% and about 50% He may be used, in some embodiments. Other mixtures are possible. In some embodiments, the mixture of process gases used in the overetch step 122 is the same as the mixture of process gases used in the primary etch step 121. The overetch step 122 may be performed using a plasma source power in the range of about 150 W to about 250 W, and may be performed using a bias power in the range of about 0 W to about 20 W. In some embodiments, the bias power may be used with an on-off duty cycle between about 20% and about 50% or at a frequency in the range of about 100 Hz to about 1000 Hz. In some embodiments, the overetch step 122 is similar to the primary etch step 121 except that the bias power used for the overetch step 122 is less than the bias power used for the primary etch step 121. For example, the bias power of the overetch step 122 may be between about 10% and about 30% of the bias power used in the primary etch step 121, though other percentages are possible. The overetch step 122 may be performed using a pressure in the range of about 5 mTorr to about 15 mTorr, with a process gas flow rate in the range of about 300 sccm to about 1000 sccm. In some embodiments, the overetch step 122 may be performed for a duration of time in the range of about 100 seconds to about 300 seconds. Other process gases or process parameters are possible.

The electrode etch back process 100 described herein can allow for a high degree of control of the etching, similar to an ALE process. In some embodiments, each etch cycle 120 etches a distance in the range from about 1 nm to about 1.5 nm, though other etch rates are possible. In some embodiments, an etch cycle 120 removes about one monolayer of the barrier layer 46 and/or the conductive material 48. The etch cycle 120 may be repeated any number of times until the desired amount of material is removed. In some embodiments, the etching process 110 comprises performing the etch cycle 120 between about 10 and about 30 times, though the etch cycle 120 may be performed a different number of times in other embodiments. In this manner, the electrode etch back process 100 can allow for improved control of the thickness T2 of the bottom electrodes 50 and improved control of the thickness T3 of the PCM layers 54 (see FIG. 12).

Turning to FIGS. 10A-D, bottom electrodes 50 are shown that have top surfaces with different shapes, in accordance with some embodiments. In some embodiments, controlling the process gases during the etch cycle 120 can control the relative etch rates of the barrier layer 46 and the conductive material 48 to control the shape of the top surfaces of the bottom electrodes 50. In some embodiments in which the barrier layer 46 is tantalum nitride and the conductive material 48 is titanium nitride, controlling the flow rate of $Cl_2$ during the etch cycle 120 controls the etch rate of the barrier layer 46, and controlling the flow rate of $BCl_3$ during the etch cycle 120 controls the etch rate of the conductive material 48.

Figure 10B:
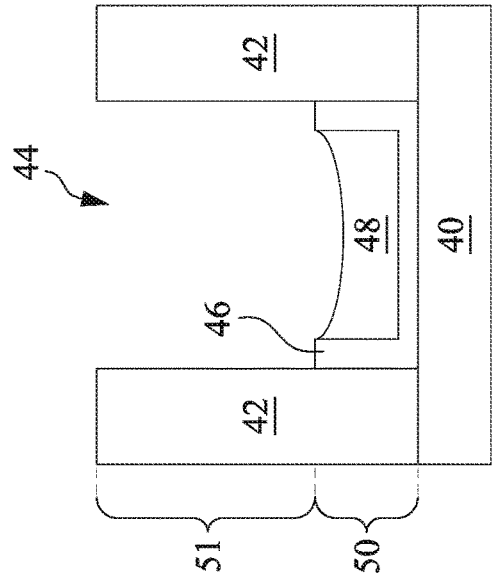
FIGS. 10A through 10D illustrate cross-sectional views of bottom electrodes of a PCRAM cell, in accordance with some embodiments.
Figure 10D:
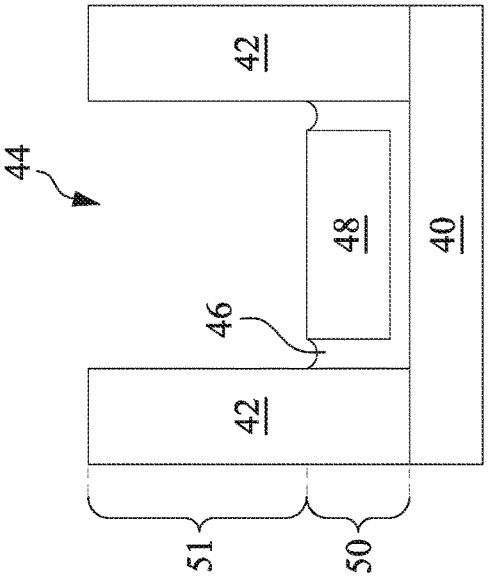
Figure 10A:
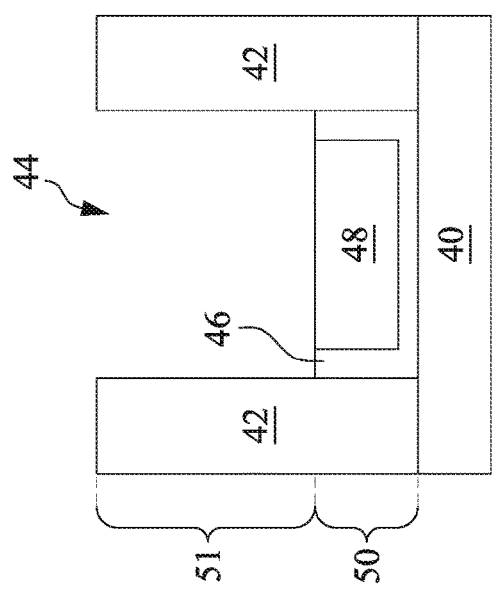

Referring to FIG. 10A, an example bottom electrode 50 is shown for which the top surfaces of the barrier layer 46 and the conductive material 48 are about level, similar to the bottom electrode 50 shown in FIG. 8. In some embodiments, the bottom electrodes 50 may be formed having approximately level barrier layer 46 and conductive material 48 surfaces by controlling the etching process 110 such that the etch rate of the barrier layer 46 is about the same as the etch rate of the conductive material 48. In some cases, the etch rate can be controlled by controlling the flow rate of a corresponding process gas during the etching process 110. As an example, in some embodiments, a ratio of the $Cl_2$ flow rate to the $BCl_3$ flow rate of about 1:6 can etch the barrier layer 46 and the conductive material 48 at similar rates. For example, $Cl_2$ may be flowed at a rate of about 30 sccm and $BCl_3$ may be flowed at a rate of about 180 sccm. This is an illustrative example, and other ratios or flow rates may be used. In some cases, forming the barrier layer 46 and the conductive material 48 with approximately level top surfaces may allow for improved diffusion blocking by the barrier layer 46.

Referring to FIG. 10B, an example bottom electrode 50 is shown for which the top surface of the conductive material 48 is concave, in accordance with some embodiments. In some embodiments, the conductive material 48 may be formed having a concave surface by etching the conductive material 48 at a greater rate than the barrier layer 46 during the etching process 110. For example, in some cases, a ratio between about 1:1 and about 1:2 for the ratio of the $Cl_2$ flow rate to the $BCl_3$ flow rate can etch the conductive material 48 at a greater rate than the barrier layer 46. This is an illustrative example, and other ratios or flow rates may be used. In some cases, forming bottom electrodes 50 having conductive material 48 with a concave top surface (e.g., that extends below the top surface of the barrier layer 46) may allow for improved diffusion blocking by the barrier layer 46.

Figure 10C:
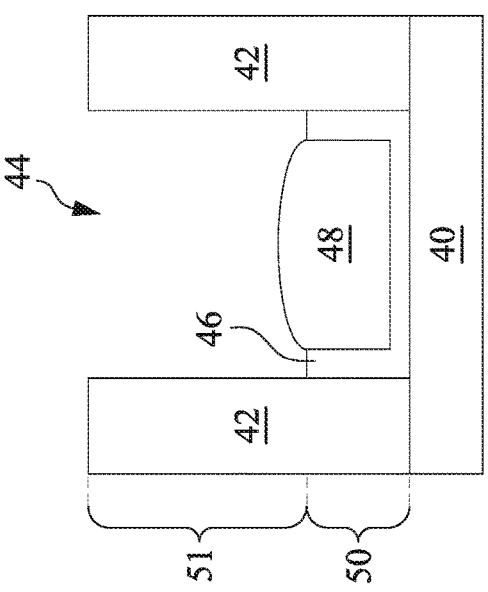

FIG. 10C shows an example bottom electrode 50 for which the top surface of the conductive material 48 is convex and protrudes above the top surface of the barrier layer 46, in accordance with some embodiments. FIG. 10D shows an example bottom electrode 50 for which the top surface of the barrier layer 46 is concave and extends below the top surface of the conductive material 48, in accordance with some embodiments. In some embodiments, a convex conductive material 48 and/or a concave barrier layer 46 may be formed by etching the barrier layer 46 at a greater rate than the conductive material 48 during the etching process 110. For example, in some cases, a ratio between about 1:1 and about 2:1 for the ratio of the $Cl_2$ flow rate to the $BCl_3$ flow rate can etch the barrier layer 46 at a greater rate than the conductive material 48. This is an illustrative example, and other ratios or flow rates may be used.

Returning to FIG. 9, after the etching process 110 is completed, a post-etch treatment 131 may be performed. In some embodiments, the post-etch treatment 131 uses a process gas such as $N_2H_2$ or the like. The post-etch treatment 131 may include a plasma process, in some embodiments. The plasma process may be performed using a plasma source power in the range of about 200 W to about 400 W. The post-etch treatment 131 may be performed using a pressure in the range of about 20 mTorr to about 80 mTorr, a process temperature in the range of about 60° C. to about 120° C., or a process gas flow rate in the range of about 200 sccm to about 1000 sccm. Other process gases or process parameters are possible. A purge may be performed after the post-etch treatment 131 to remove process gases, reaction products, or the like.

The electrode etch back process 100 shown in FIG. 9 is an example electrode etch back process, and may be different in other embodiments. Some steps and processes described may be omitted or repeated, or other steps or processes than described may be included. For example, in other embodiments, an etch cycle 120 may include only one step (e.g., only the primary etch step 121) or may include more than three steps, any of which may be similar or different from the steps described for the electrode etch back process 100. Other variations of the electrode etch back process 100 are possible.

Figure 11:
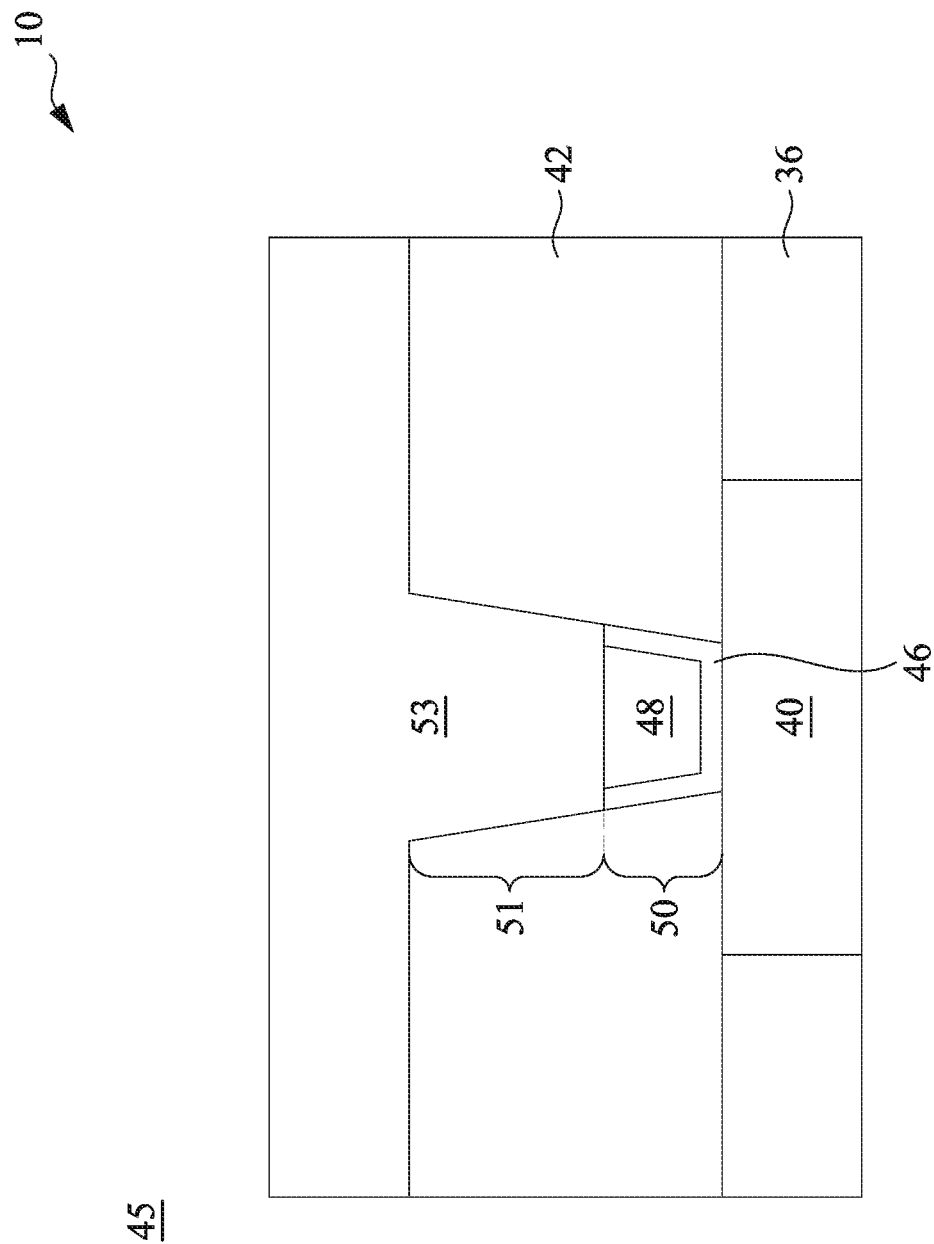
FIGS. 11 through 14 illustrate cross-sectional views of intermediate stages in the formation of a PCRAM cell, in accordance with some embodiments.

Turning to FIG. 11, a phase-change material (PCM) 53 is formed within the openings 44 and covers the bottom electrodes 50, in accordance with some embodiments. As shown in FIG. 11, the PCM 53 may be deposited to fill the recessed regions 51 and may also cover surfaces of the IMD layer 42. In other embodiments, the PCM 53 may be deposited to partially fill the recessed regions 51. In some embodiments, the PCM 53 is a chalcogenide material such as GeSbTe (GST) or GeSbTeX, in which X is a material such as Ag, Sn, In, Si, N, or the like. Other materials are possible. The PCM 53 may be formed using a suitable deposition process, such as PVD, CVD, plasma-enhanced CVD (PECVD), ALD, or the like.

Figure 12:
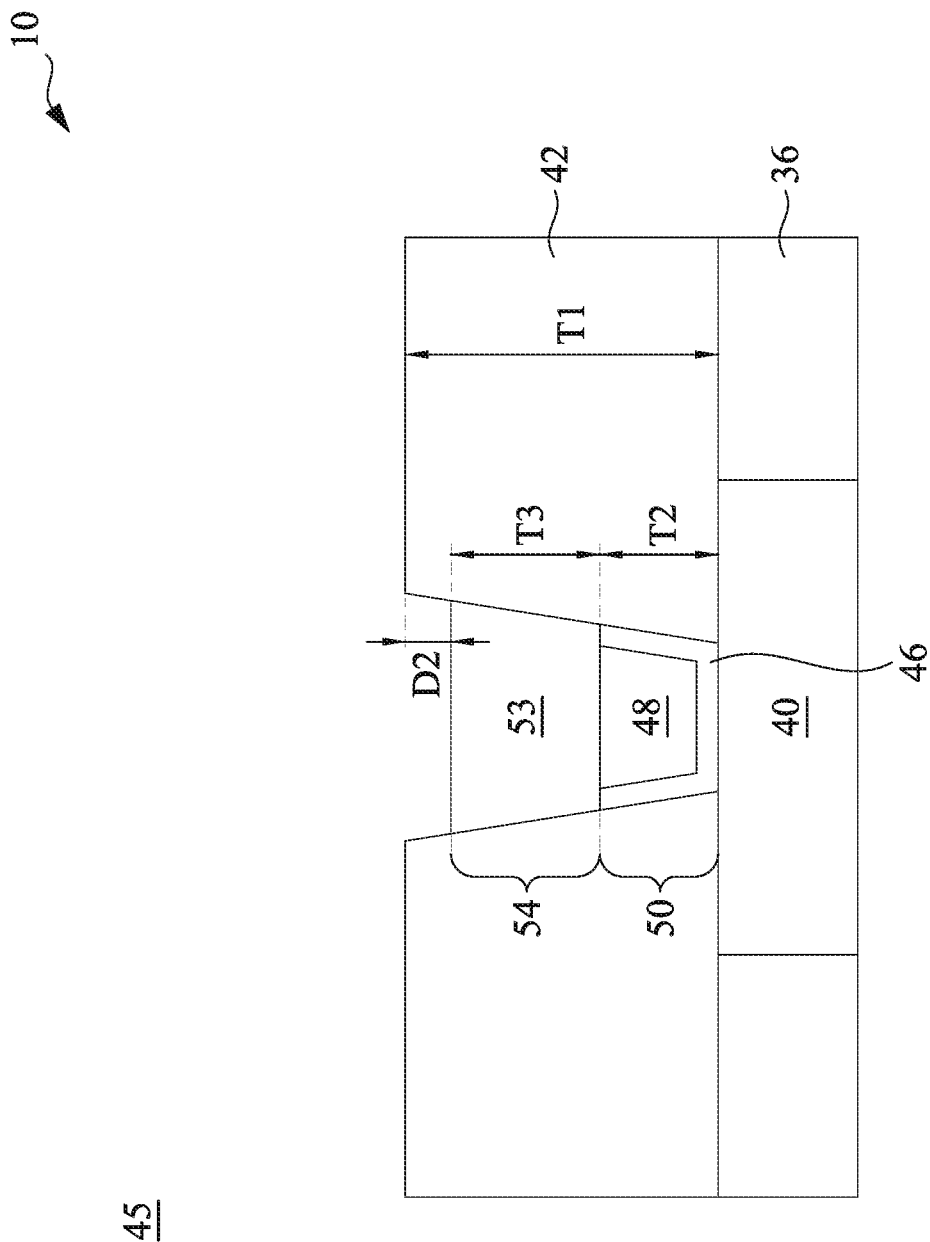

In FIG. 12, a PCM etch back process is performed to etch the PCM 53 and form PCM layers 54, in accordance with some embodiments. The PCM etch back process removes PCM 53 from the top surface of the IMD layer 42, and the remaining PCM 53 forms the PCM layers 54 of the PCRAM cells 60 (see FIG. 14). The PCM etch back process may form PCM layers 54 with a top surfaces about level with the top surface of the IMD layer 42, or the top surfaces of the PCM layers 54 may be recessed from the top surface of the IMD layer 42, as shown in FIG. 12. In some embodiments, the top surface of the PCM layer 54 may be recessed from the top surface of the IMD layer 42 a depth D2 that is in the range from about 40 nm to about 60 nm. Other distances are possible. Recessing the PCM layers 54 from the top surface of the IMD layer 42 allows the PCM layers 54 to be more confined by the IMD layer 42, which can improve heat transfer efficiency and improve operation of the PCRAM cells 60. Thus, a greater depth D2 can result in increased confinement of the PCM layers 54. In some embodiments, a planarization process, such as a CMP process, may be performed prior to performing the PCM etch back process. The PCM layers 54 may be formed having a flat top surface, a concave top surface, a convex top surface, an irregular top surface, or the like.

In some embodiments, the PCM etch back process includes a plasma process, such as a plasma etch. The plasma process may include flowing one or more process gases into a process chamber and then igniting the one or more process gases into a plasma. For example, the PCM etch back process may include a plasma process using one or more process gases such as HBr, Ar, He, the like, other gases, or combinations thereof. For example, a mixture of HBr, Ar, and He may be used that has between about 20% and about 40% HBr, between about 30% and about 50% Ar, and/or between about 10% and about 20% He, in some embodiments. Other mixtures are possible. The plasma process may be performed using a plasma source power in the range of about 100 W to about 400 W or using a bias power in the range of about 100 W to about 200 W. In some embodiments, no bias power is applied. The PCM etch back process may be performed using a pressure in the range of about 3 mTorr to about 10 mTorr, a process temperature in the range of about 40° C. to about 70° C., or a process gas flow rate in the range of about 100 sccm to about 300 sccm. Other process gases or process parameters are possible.

In some cases, forming the PCM layers 54 within the openings 44 as described herein can allow for improved sidewall quality of the PCM layers 54. For example, in some cases, forming a PCM layer using an etching process (e.g., as part of photolithographic patterning) can cause damage to the PCM layer during the etching process. By forming the PCM layers 54 without etching the sidewalls of the PCM layers 54, etching damage to the sidewalls of the PCM layers 54 can be avoided. Thus, the PCM layers 54 formed as described herein can have improved sidewall quality, which can reduce defects within the PCM layers 54, reduce electrical or thermal leakage of the PCRAM cells 60, and improve the power efficiency of the PCRAM cells 60 during operation.

As shown in FIG. 12, the PCM etch back process removes the PCM 53 from the top surface of the IMD layer 42 and forms a PCM layer 54 having a substantially uniform thickness. In some embodiments, the PCM layers 54 may have a thickness T3 that is in the range from about 10 nm to about 30 nm, though other thicknesses are possible. In some embodiments, the thickness T3 may be between about 30% and about 70% of the thickness T1 of the IMD layer 42, or the thickness T3 may be between about 30% and about 100% of the depth D1 of the recessed region 51. In some embodiments, the ratio of the thickness T2 of the bottom electrode 50 to the thickness T3 of the PCM layers 54 is between about 1:1 and about 1:3. Other distances, percentages, or ratios are possible. In this manner, the absolute thicknesses or relative thicknesses of the bottom electrode 50 and PCM layers 54 may be controlled to achieve certain characteristics, such as size, resistance, power consumption, thermal efficiency, or the like.

In FIG. 13, a top electrode material 55 is deposited over the IMD layer 42 and covering the PCM layers 54, in accordance with some embodiments. The top electrode material 55 may extend below a top surface of the IMD layer 42 to contact the PCM layers 54, as shown in FIG. 13. In some embodiments, the top electrode material 55 includes a barrier layer and a conductive material over the barrier layer, which are not individually illustrated in the figures. The barrier layer may be similar to the barrier layer 46 described for FIG. 6, and may be formed in a similar manner. For example, the barrier layer of the top electrode material 55 may include tantalum nitride conformally deposited on the IMD layer 42 and on the PCM layers 54, though other materials are possible. After depositing the barrier layer of the top electrode material 55, a conductive material is deposited over the barrier layer. The conductive material may be similar to the conductive material 48 described for FIG. 6, and may be formed in a similar manner. For example, the conductive material of the top electrode material 55 may include titanium nitride deposited on the barrier layer, though other materials are possible. In some embodiments, a planarization process (e.g., a CMP or grinding process) is performed on the top electrode material after deposition. In some embodiments, the top electrode material 55 may be formed having a thickness $T_4$ on the top surface of the IMD layer 42 that is in the range from about 20 nm to about 50 nm, though other thicknesses are possible.

Turning to FIG. 14, the top electrode material 55 is patterned to form top electrodes 56 of the PCRAM cells 60, in accordance with some embodiments. The top electrode material 55 may be patterned using acceptable photolithography and etching techniques. For example, a mask layer (not pictured) such as a hard mask layer or a photoresist layer (e.g., a single-layer photoresist, a tri-layer photoresist, or the like) may be formed over the top electrode material 55 and patterned. The top electrode material 55 may then be etched using the patterned mask layer as an etching mask, with the remaining portions of the top electrode material 55 forming the top electrodes 56. The top electrode material 55 may be etched using an anisotropic etching process such as a suitable dry etching process. After forming the top electrodes 56, remaining portions of the mask layer may then be removed using e.g., an ashing process, an etching process, or another suitable process. In this manner, a PCRAM cell 60 may be formed that includes a bottom electrode 50, a PCM layer 54, and a top electrode 56. In some embodiments, the sides of the PCM layer 54 are surrounded by the IMD layer 42, and the bottom and top of the PCM layer 54 are covered by the bottom electrode 50 and the top electrode 56, respectively.

As shown in FIG. 14, the top electrodes 56 may extend over the top surface of the IMD layer 42, and have a thickness T4 above the top surface of the IMD layer 42. In some embodiments, portions of the top electrodes 56 may extend below the top surface of the IMD layer 42 to contact the PCM layer 54. Thus, portions of the top electrodes 56 over the PCM layer 54 may have a thickness greater than the thickness T4. In some embodiments, the top electrodes 56 may have a width W3 that is in the range of about 10 nm to about 30 nm. The width W3 of the top electrodes may be greater than, about the same as, or less than the width W1 of the underlying metallization layer 40.

Turning to FIG. 15, a cross-sectional view of the device region 12 of a wafer 10 is shown, in accordance with some embodiments. The cross-sectional view shown in FIG. 15 is similar to that shown in FIGS. 1-4, except that PCRAM cells 60 have been formed as described for FIGS. 5-14. As shown in FIG. 15, the PCRAM cells 60 are connected to the metallization layer(s) 40, and may also be connected to access transistors 22 or other devices formed in the semiconductor substrate 20.

Figure 16:
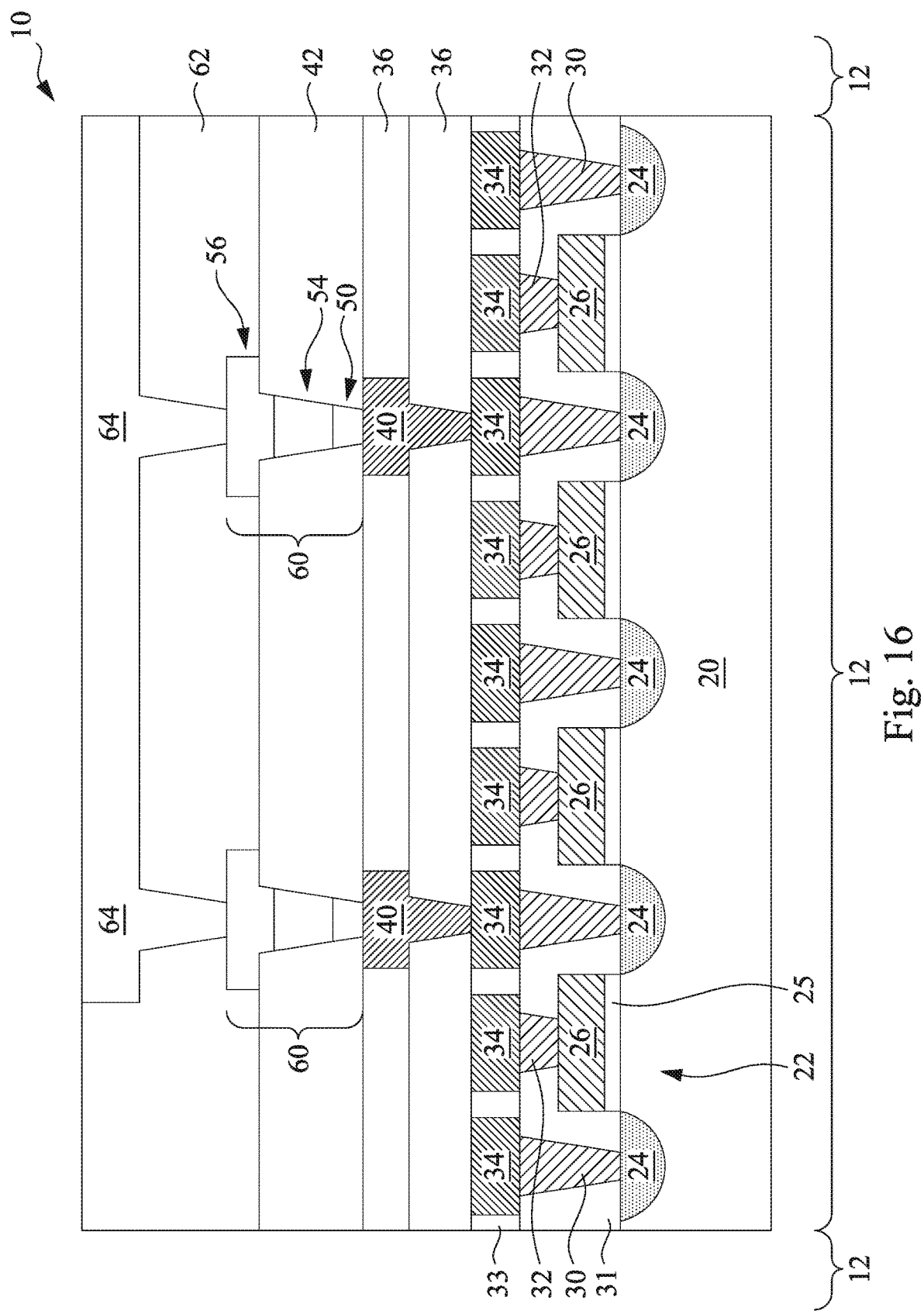
Figure 17:
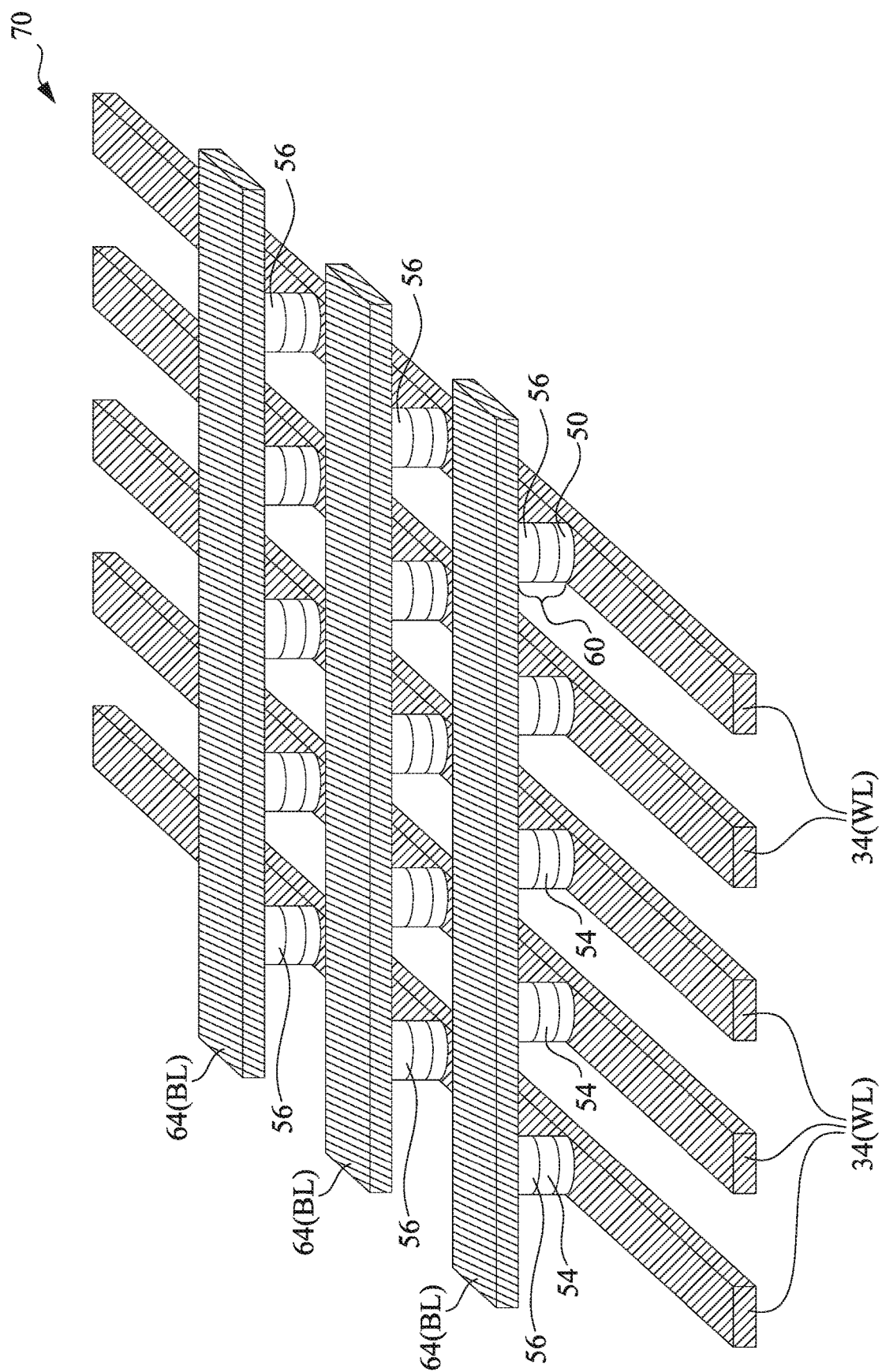
FIG. 17 schematically illustrates a perspective view of a PCRAM array, in accordance with some embodiments.

In FIG. 16, an IMD layer 62 is formed over the IMD layer 42 and top electrodes 56, and a metallization layer 64 is formed in the IMD layer 62, in accordance with some embodiments. In some embodiments, some or all of the metallization layer 64 may be used as bit lines (BL) that are connected to rows of PCRAM cells 60 in a PCRAM array 70, described in greater detail below for FIG. 17. In some embodiments, an etch stop layer (not illustrated in the figure) is deposited over the IMD layer 42 and the top electrodes 56 prior to forming the IMD layer 62. The IMD layer 62 may be formed of dielectric material similar to those described previously for the IMD layer 42, the dielectric layers 36, or the IMD layer 33, and may be formed in a similar manner. The metallization layer 64 may include metal lines and vias formed in the IMD layer 62. The metallization layer 64 may formed using a damascene process, such as a single damascene process, a dual damascene process, or the like. For example, the metallization layer 64 may be formed by etching into the IMD layer 62 to form via openings (for vias) and trenches (for metal lines), filling the via openings and trenches with a conductive material, and then performing a planarization process such as a CMP process or a grinding process to remove excess conductive material. The metallization layer 64 may be formed in a similar manner as the metal lines 34 or the metallization layer 40, in some embodiments, or may be formed using another suitable technique. It is appreciated that although one metallization layer 64 (including metal lines and underlying vias) is illustrated in FIG. 16, there may be additional metallization layers formed in additional IMD layers over the IMD layer 62. In subsequent processes, the features overlying the metallization layer 64 and IMD layer 62 are formed to finish the formation of wafer 10 and the device regions 12. A singulation process may then be performed to separate the device regions 12 of wafer 10 into the individual device regions 12.

FIG. 17 schematically illustrates a perspective view of the PCRAM array 70, which includes PCRAM cells 60 arranged as an array, in accordance with some embodiments. In the embodiment shown, word lines (WL) are electrically connected to the bottom electrodes 50 of respective columns of PCRAM cells 60 in the PCRAM array 70. Each column of the PCRAM array 70 has an associated word line, and the PCRAM cells 60 in a column are connected to the word line for that column. The word lines may be, for example, metal lines 34 that are connected to the access transistors 22. Bit lines (BL) are connected to the top electrodes 56 of respective rows of PCRAM cells 60 in the PCRAM array 70. Each row of the PCRAM array 70 has an associated bit line, and the PCRAM cells 60 in a row are connected to the bit line for that row. The bit lines may be, for example, metal lines and vias of the metallization layer 64. Some features are not shown in FIG. 17, such as the access transistors 22, metallization layer 40, and the like. Each PCRAM cell 60 of the PCRAM array 70 may be selected by the appropriate combination of word line and bit line. For example, a particular PCRAM cell 60 may be selected (e.g., for reading or writing operations) by accessing the single word line connected to that PCRAM cell 60 and also accessing the single bit line connected to that PCRAM cell 60. Other configurations of bit lines, word lines, or PCRAM cells are possible.

The resistance of the PCM layer 54 of each PCRAM cell 60 is programmable, and can be changed between a high-resistance state and a low-resistance state, which can correspond to the two states of a binary code. The PCRAM cell 60 can be changed (e.g., the phase of the PCM layer 54 can be changed) between the high-resistance state and the low resistance state by controlling the heating of the PCM layer 54 by the bottom electrode 50 and/or the top electrode 56 as current passes through the PCRAM cell 60. In this manner, a value can be written to a PCRAM cell 60 by programming the resistance of its PCM layer 54 using its corresponding access transistor 22, and a value can be read from a PCRAM cell 60 by measuring the resistance of its PCM layer 54 with its corresponding access transistor 22. The PCRAM cells 60 described herein include a fully confined PCM layer 54 with sidewalls that are substantially free of the barrier layer 46, which can improve the control and efficiency of the heating or reduce power consumption during programming of the PCRAM cell 60.

Embodiments may achieve advantages. Using the techniques herein can form phase-change RAM (PCRAM) cells for which the sidewalls of the phase-change material (PCM) layer are fully confined in a dielectric layer. For example, a PCM layer that does not extend over a top surface of the dielectric layer may be formed. This can result in improved heat confinement and improved thermal transfer efficiency, which can allow the PCRAM cells to be programmed using a smaller voltage and/or current. For example, by forming a PCM layer confined by a dielectric layer, heating of the PCM layer during programming can be better localized to the center of the PCM layer. Thus, the phase change of the PCM layer may spread from its center, which can reduce boundary effects due to the bottom electrode and/or top electrode that can reduce efficiency. Additionally, the techniques described herein allow for the removal of electrode barrier layer material before formation of the PCM layer. The presence of barrier layer material on or near the PCM layer can cause thermal or electrical leakage, and thus removing the barrier layer material can reduce thermal or electrical leakage within a PCRAM cell. Accordingly, the techniques described herein allow for improved energy efficiency of a PCRAM array. Additionally, the techniques described herein form the PCRAM cells without etching the sidewalls of the PCM layer, which can reduce or eliminate damage to the PCM layer due to etching or defects formed in the PCM layer due to etching.

In some embodiments, a method includes forming a dielectric layer over a substrate, the dielectric layer having a top surface; etching an opening in the dielectric layer; forming a bottom electrode within the opening, the bottom electrode including a barrier layer; forming a phase-change material (PCM) layer within the opening and on the bottom electrode, wherein a top surface of the PCM layer is level with or below the top surface of the dielectric layer; and forming a top electrode on the PCM layer. In an embodiment, sidewalls of the PCM layer are free of the barrier layer. In an embodiment, forming the bottom electrode includes depositing the barrier layer in the opening; depositing a conductive material on the barrier layer; and etching the barrier layer and the conductive material, wherein the etching exposes sidewalls of the opening. In an embodiment, after etching the barrier layer and the conductive material, the top surface of the conductive material is convex. In an embodiment, after etching the barrier layer and the conductive material, the top surface of the barrier layer is level with the top surface of the conductive material. In an embodiment, forming the PCM layer includes depositing a phase-change material over the bottom electrode and the dielectric layer; and etching the phase-change material to remove the phase-change material from the top surface of the dielectric layer. In an embodiment, the bottom electrode has a thickness that is between 25% and 50% of the thickness of the dielectric layer. In an embodiment, the PCM layer has a thickness that is between 30% and 70% of the thickness of the dielectric layer.

In some embodiments, a method includes depositing an inter-metal dielectric (IMD) layer over a first conductive feature; forming an opening in the IMD layer that exposes the first conductive feature; forming a second conductive feature in the opening; performing a first etch back process to recess the second conductive feature in the opening; depositing a phase-change material (PCM) in the opening and over the second conductive feature; performing a second etch back process to remove upper portions of the PCM; and depositing a conductive material on the PCM. In an embodiment, forming the second conductive feature includes depositing a layer of tantalum nitride and depositing a layer of titanium nitride on the layer of tantalum nitride. In an embodiment, the first etch back process is an atomic layer etching (ALE) process. In an embodiment, the first etch back process includes flowing first process gases into a process chamber and performing a plurality of etching cycles, wherein each etching cycle includes flowing second process gases into the process chamber; igniting the second process gases into a plasma while using a first voltage bias; and igniting the second process gases into a plasma while using a second voltage bias that is less than the first voltage bias. In an embodiment, the second process gases include $Cl_2$, $BCl_3$, Ar, and/or He. In an embodiment, the first etch back process includes, prior to performing the plurality of etching cycles, flowing third process gases into the process chamber; and igniting the third process gases into a plasma. In an embodiment, the second etch back process includes flowing fourth process gases into a process chamber and igniting the fourth process gases into a plasma.

In some embodiments, a device includes a metallization layer over a semiconductor substrate; an inter-metal dielectric (IMD) layer over the metallization layer; and a phase-change random access memory (PCRAM) cell, including a bottom electrode in the IMD layer, wherein the bottom electrode is electrically connected to the metallization layer; a phase-change material (PCM) layer on the bottom electrode and within the IMD layer, wherein the PCM layer is surrounded by the IMD layer and wherein the top surface of the IMD layer is free of the PCM layer; and a top electrode on the PCM layer and the top surface of the IMD layer. In an embodiment, the top electrode extends below the top surface of the IMD layer to contact the PCM layer. In an embodiment, the sidewalls of the PCM layer physically contact the IMD layer. In an embodiment, the PCM layer includes GeSbTe (GST). In an embodiment, the PCM layer has a uniform thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a substrate, the dielectric layer having a top surface;
   etching an opening in the dielectric layer;
   forming a bottom electrode within the opening, the bottom electrode comprising a barrier layer;
   forming a phase-change material (PCM) layer within the opening and on the bottom electrode, wherein a top surface of the PCM layer is level with or below the top surface of the dielectric layer, wherein sidewalls of the PCM layer are free of the barrier layer; and
   forming a top electrode on the PCM layer.

2. The method of claim 1, wherein forming the bottom electrode comprises:
   depositing the barrier layer in the opening;
   depositing a conductive material on the barrier layer; and
   etching the barrier layer and the conductive material, wherein the etching exposes sidewalls of the opening.

3. The method of claim 2, wherein, after etching the barrier layer and the conductive material, the top surface of the conductive material is convex.

4. The method of claim 2, wherein, after etching the barrier layer and the conductive material, the top surface of the barrier layer is level with the top surface of the conductive material.

5. The method of claim 1, wherein forming the PCM layer comprises:
   depositing a phase-change material over the bottom electrode and the dielectric layer; and
   etching the phase-change material to remove the phase-change material from the top surface of the dielectric layer.

6. The method of claim 1, wherein the bottom electrode has a thickness that is between 25% and 50% of the thickness of the dielectric layer.

7. The method of claim 1, wherein the PCM layer has a thickness that is between 30% and 70% of the thickness of the dielectric layer.

8. The method of claim 1, wherein the PCM layer physically contacts the dielectric layer.

9. A method comprising:
   depositing an inter-metal dielectric (IMD) layer over a first conductive feature;
   forming an opening in the IMD layer that exposes the first conductive feature;
   forming a second conductive feature in the opening, comprising filling the opening with a conductive material;
   performing a first etch back process to recess the second conductive feature in the opening;
   depositing a phase-change material (PCM) in the opening and over the second conductive feature;

performing a second etch back process to remove upper portions of the PCM; and depositing a conductive material on the PCM.

10. The method of claim 9, wherein forming the second conductive feature comprises depositing a layer of tantalum nitride and depositing the conductive material on the layer of tantalum nitride, wherein the conductive material comprises titanium nitride.

11. The method of claim 9, wherein the first etch back process is an atomic layer etching (ALE) process.

12. The method of claim 9, wherein the first etch back process comprises:

flowing first process gases into a process chamber; and performing a plurality of etching cycles, wherein each etching cycle comprises:

flowing second process gases into the process chamber;

igniting the second process gases into a plasma while using a first voltage bias; and igniting the second process gases into a plasma while using a second voltage bias that is less than the first voltage bias.

13. The method of claim 12, wherein the second process gases comprises $Cl_2$, $BCl_3$, Ar, and He.

14. The method of claim 12, wherein the first etch back process further comprises:

prior to performing the plurality of etching cycles, flowing third process gases into the process chamber; and igniting the third process gases into a plasma.

15. The method of claim 9, wherein the second etch back process comprises:

flowing fourth process gases into a process chamber; and igniting the fourth process gases into a plasma.

16. A method comprising:

forming a metallization layer over a semiconductor substrate;

forming an inter-metal dielectric (IMD) layer over the metallization layer; and forming a phase-change random access memory (PCRAM) cell, comprising:

forming a bottom electrode in the IMD layer, wherein the bottom electrode is electrically connected to the metallization layer, wherein a top surface of the bottom electrode is below a top surface of the IMD layer;

forming a phase-change material (PCM) layer on the bottom electrode and within the IMD layer, wherein a top surface of the PCM layer is below the top surface of the IMD layer; and forming a top electrode on the PCM layer and extending on the top surface of the IMD layer, wherein the top electrode is electrically connected to the PCM layer.

17. The method of claim 16, wherein the top surface of the IMD layer is free of the PCM layer.

18. The method of claim 16, wherein the sidewalls of the PCM layer physically contact the IMD layer.

19. The method of claim 16, wherein the PCM layer comprises GeSbTe (GST).

20. The method of claim 16, wherein the PCM layer has a uniform thickness.

* * * * *